US008928030B2

(12) United States Patent
Lu

(10) Patent No.: US 8,928,030 B2
(45) Date of Patent: Jan. 6, 2015

(54) SEMICONDUCTOR DEVICE, METHOD FOR MANUFACTURING THE SEMICONDUCTOR DEVICE, AND METHOD FOR CONTROLLING THE SEMICONDUCTOR DEVICE

(71) Applicant: Fuji Electric Co., Ltd., Kawasaki-shi (JP)

(72) Inventor: Hong-fei Lu, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/863,374

(22) Filed: Apr. 15, 2013

(65) Prior Publication Data

US 2014/0111270 A1   Apr. 24, 2014

(30) Foreign Application Priority Data

Oct. 24, 2012   (JP) ................................. 2012-235180

(51) Int. Cl.

| | | |
|---|---|---|
| H01L 29/739 | (2006.01) | |
| H01L 29/74 | (2006.01) | |
| H01L 21/8238 | (2006.01) | |
| H03K 17/66 | (2006.01) | |
| H01L 29/66 | (2006.01) | |
| H01L 29/32 | (2006.01) | |
| H01L 29/40 | (2006.01) | |
| H01L 29/06 | (2006.01) | |
| H01L 29/08 | (2006.01) | |
| H03K 17/567 | (2006.01) | |

(52) U.S. Cl.
CPC ............ *H01L 29/7395* (2013.01); *H03K 17/66* (2013.01); *H01L 29/66348* (2013.01); *H03K 17/567* (2013.01); *H01L 29/32* (2013.01); *H01L 29/404* (2013.01); *H01L 29/66333* (2013.01); *H01L 29/0619* (2013.01); *H01L 29/0661* (2013.01); *H01L 29/0834* (2013.01)
USPC ........... 257/139; 257/131; 257/133; 257/140; 257/491; 257/E21.135; 257/E21.388; 257/E27.016; 257/E27.019; 257/E29.211; 327/432; 438/133; 438/138; 438/514

(58) Field of Classification Search
CPC .................... H01L 29/66348; H01L 29/7395; H03K 17/66
USPC .......... 257/131, 133, 139, 140, 491, E21.135, 257/E21.388, E27.016, E27.019, E29.211; 327/432; 438/133, 138, 514
See application file for complete search history.

(56) References Cited

U.S. PATENT DOCUMENTS

| | | | | |
|---|---|---|---|---|
| 6,774,407 | B2 * | 8/2004 | Kushida ......................... | 257/131 |
| 2004/0256691 | A1 * | 12/2004 | Nemoto et al. ................ | 257/491 |
| 2007/0210386 | A1 * | 9/2007 | Mori .............................. | 257/359 |
| 2012/0313139 | A1 * | 12/2012 | Matsuura et al. ............. | 257/139 |

OTHER PUBLICATIONS

David Lu et al., "1700V Reverse-Blocking IGBTs with V-Groove Isolation Layer for Multi-Level Power Converters," PCIM Europe 2012 (Power Conversion Intelligent Motion Europe 2012), Ma 8-10, 2012, pp. 815-821.

* cited by examiner

*Primary Examiner* — Dao H Nguyen

(74) *Attorney, Agent, or Firm* — Rabin & Berdo, P.C.

(57) ABSTRACT

An A-NPC circuit is configured so that the intermediate potential of two connected IGBTs is clamped by a bidirectional switch including two RB-IGBTs. Control is applied to the turn-on di/dt of the IGBTs during the reverse recovery of the RB-IGBTs. The carrier life time of an $n^-$ drift region in each RB-IGBT constituting the bidirectional switch is comparatively longer than that in a typical NPT structure device. A low life time region is also provided in the interface between the $n^-$ drift region and a p collector region, and extends between the $n^-$ drift region and the p collector region. Thus, it is possible to provide a low-loss semiconductor device, a method for manufacturing the semiconductor device and a method for controlling the semiconductor device, in which the reverse recovery loss is reduced while the reverse recovery current peak and the jump voltage peak during reverse recovery are suppressed.

11 Claims, 37 Drawing Sheets

FIG. 22

| | FIRST EXAMPLE (RB-IGBT) | FIRST COMPARATIVE EXAMPLE (IGBT+FWD) |
|---|---|---|
| ON-STATE VOLTAGE Von(V) | 3.1 | 5.14 |
| TURN-OFF LOSS Eoff (mJ/pulse) | 14.3 | 14.5 |
| TURN-ON LOSS Eon (mJ/pulse) | 22 | 20.1 |
| REVERSE RECOVERY LOSS Err (mJ/pulse) | 16.8 | 14.5 |

SEMICONDUCTOR DEVICE, METHOD FOR MANUFACTURING THE SEMICONDUCTOR DEVICE, AND METHOD FOR CONTROLLING THE SEMICONDUCTOR DEVICE

BACKGROUND OF THE INVENTION

1. Field of the Invention

The present invention relates to a semiconductor device, a method for manufacturing the semiconductor device, and a method for controlling the semiconductor device.

2. Description of the Related Art

High-voltage discrete semiconductors play a major role in power conversion equipment. For example, IGBTs (Insulated Gate Bipolar Transistors), MOSFETs (Metal Oxide Semiconductor Field Effect Transistors), FWDs (Free Wheeling Diodes), etc. are known as discrete semiconductors.

IGBT on-state voltage drops due to conductivity modulation in a drift region. Due to this property, IGBTs are often used for applications to high-voltage equipment. RB-IGBTs (Reverse Blocking IGBTs) are also known. An RB-IGBT has a termination structure in which a pn junction between a collector region and a drift region of the IGBT is extended from the back surface of a semiconductor chip to the front surface thereof. In the RB-IGBT, a high reverse breakdown voltage can be secured even when a reverse voltage is applied to the pn junction between the collector region and the drift region.

In recent years, power conversion equipment with high conversion efficiency has been in widespread use in the power electronics field due to increasing awareness of realization of a low-carbon society with a reduced amount of carbon oxide ($CO_2$) emissions. Replacement of conventional 2-level converters with higher-efficiency 3-level converters of an NPC (Neutral Point Clamped) system or an advanced NPC (A-NPC) system has also progressed in equipment such as UPS (Uninterruptible Power Supplies) or photovoltaic PCS (Power Conditioning Systems).

In an NPC 3-level converter, intermediate potential (output point potential) between two IGBTs connected in series as two main switches is clamped by a diode in order to improve the conversion efficiency. On the other hand, in an A-NPC 3-level converter (hereinafter referred to as "A-NPC circuit"), intermediate potential between two IGBTs connected in series as two main switches is clamped by a bidirectional switch consisting of combination of IGBTs and FWDs in order to improve the conversion efficiency. FIGS. 32 and 33 are circuit diagrams showing typical configurations of A-NPC 3-level converters. The A-NPC circuit shown in FIG. 32 has a main switch 100, a bidirectional switch 110 and a DC link capacitor 120.

The main switch 100 is constituted by IGBTs 101 and 102 connected in series, and FWDs 103 and 104 connected in parallel to the IGBTs 101 and 102. The bidirectional switch 110 is constituted by the combination of IGBTs 111 and 112 and FWDs 113 and 114. The FWDs 113 and 114 secure a reverse breakdown voltage. The bidirectional switch 110 is connected to an intermediate potential point of the main switch 100, that is, a connection point 105 between the IGBTs 101 and 102 so as to clamp the intermediate potential of the main switch 100. The DC link capacitor 120 is constituted by capacitors 121 and 122 each having voltage half as high as DC power supply $V_{DC}$. The voltage of the DC link capacitor 120 is controlled by the bidirectional switch 110 connected to a connection point 123 between the capacitors 121 and 122.

Moreover, the IGBTs 111 and 112 and the FWDs 113 and 114 constituting the bidirectional switch 110 in the A-NPC circuit shown in FIG. 32 may be replaced by two RB-IGBTs so that the efficiency can be further enhanced. Specifically, in an A-NPC circuit shown in FIG. 33, a bidirectional switch 130 is constituted by RB-IGBTs 131 and 132 connected in anti-parallel. The end portion of the bidirectional switch 130 where the collector of the RB-IGBT 131 and the emitter of the RB-IGBT 132 are connected is connected to the intermediate potential point (connection point 105) of the main switch 100. The end portion of the bidirectional switch 130 where the emitter of the RB-IGBT 131 and the collector of the RB-IGBT 132 are connected is connected to the connection point 123 between the capacitors 121 and 122. When the bidirectional switch 130 is arranged using the RB-IGBTs 131 and 132, the number of parts can be reduced and the on-resistance can be lowered. Thus, the conversion efficiency can be further enhanced.

Next, the configuration of an IGBT in the related art will be described along an example of an IGBT with a planer gate structure. FIG. 34 is a sectional view showing the configuration of an IGBT in the related art. As shown in FIG. 34, a p base region 142 is selectively provided on one side of an $n^-$ drift region 141. An $n^+$ emitter region 143 is selectively provided inside the p base region 142. A gate electrode 146 is provided on the surface of a portion of the p base region 142 which is located between the $n^+$ emitter region 143 and the $n^-$ drift region 141, so that a gate insulating film 145 is put between the gate electrode 146 and the p base region 142.

An emitter electrode 147 short-circuits the p base region 142 with the $n^+$ emitter region 143. On the other hand, the emitter electrode 147 is electrically isolated from the gate electrode 146 by a not-shown interlayer insulating film. A p collector region 148 is provided over all of the other side of the $n^-$ drift region 141. An n buffer region 150 is provided between the $n^-$ drift region 141 and the p collector region 148 so as to touch the $n^-$ drift region 141 and the p collector region 148. A collector electrode 149 touches the p collector region 148.

Next, the configuration of an FWD in the related art will be described. FIG. 35 is a sectional view showing the configuration of an FWD in the related art. As shown in FIG. 35, an n low-resistance region 152 is provided over all of one side of an $n^-$ drift region 151. An $n^+$ cathode region 153 is provided over all of an opposite side of the n low-resistance region 152 to the $n^-$ drift region 151. A p anode region 154 is provided over all of the other side of the $n^-$ drift region 151. A cathode electrode 155 touches the $n^+$ cathode region 153. A cathode electrode 156 touches the p anode region 154.

Next, the configuration of an RB-IGBT in the related art will be described. FIG. 36 is a sectional view showing the configuration of an RB-IGBT in the related art. As shown in FIG. 36, a p base region 142, an $n^+$ emitter region 143, a gate insulating film 145, a gate electrode 146 and an emitter electrode 147 are provided on one side of an $n^-$ drift region 141 in an active region 140 in the same manner as in the IGBT shown in FIG. 34. An n region 161 is provided between the $n^-$ drift region 141 and the p base region 142. A p collector region 148 and a collector electrode 149 are provided on the other side of the $n^-$ drift region 141 in the same manner as in the IGBT shown in FIG. 34.

A $p^+$ isolation region (through silicon isolation region) 170 is provided in the outer circumferential portion of the $n^-$ drift region 141 so as to penetrate the $n^-$ drift region 141 from one side of the $n^-$ drift region 141 and reach the p collector region 148. A field stopper electrode 171 is electrically connected to the $p^+$ isolation region 170. A terminal structure 180 is provided between the p+ isolation region 170 and the active region 140. The terminal structure 180 is constituted by a floating p region 181 selectively provided on one side of the n− drift region 141, and a field plate electrode 182 electrically connected to the p region 181. The reference numerals 144 and 162 represent a p+ contact region and an interlayer insulating film.

Another RB-IGBT has been proposed, wherein the thickness of the outer circumferential portion of an n− drift region 141 is made smaller than the thickness of the active region side by a groove provided in the outer circumferential portion of the n− drift region 141 (for example, see David. H. Lu et al., "1700V Reverse-Blocking IGBTs with V-Groove Isolation Layer for Multi-Level Power Converters", Nuremberg, PCIM Europe 2012 (Power Conversion Intelligent Motion Europe 2012), May 8-10, 2012, p. 815-821). The configuration of the RB-IGBT according to the aforementioned non-patent literature will be described with reference to FIG. 37. FIG. 37 is a sectional view showing another example of the configuration of an RB-IGBT in the related art. As shown in FIG. 37, a groove 172 is provided on the other side of the n− drift region 141 so as to reach a p+ isolation region 170a.

The p collector region 148 extends to form a p collector region 170b on a side wall of the groove 172. The p+ isolation region 170a provided on one side of the n− drift region 141 and the p collector region 148 provided on the other side of the n− drift region 141 are coupled by the p collector region 170b provided on the side wall of the groove 172. The collector electrode 149 is provided to spread from the p collector regions 148 and 170b to the p+ isolation region 170a. The other configuration of the RB-IGBT shown in FIG. 37 is the same as that of the RB-IGBT shown in FIG. 36.

When a voltage not lower than a threshold voltage is applied to the gate electrode 146 in the aforementioned IGBT (FIG. 34) or RB-IGBT (FIG. 36 or 37), a channel which allows electrons to flow into the p base region 142 near the gate insulating film 145 is formed so that a fixed voltage drop occurs between the n− drift region 141 and the n+ emitter region 143 so as to allow a current to flow therein (continuity state). The voltage drop in the rated current is referred to as on-state voltage Von. At that time, electrons are injected into the n− drift region 141 from the n+ emitter region 143 side while positive holes are injected likewise from the p collector region 148 side.

Thus, in the continuity state, many more positive holes and electrons (bipolar carriers) than in the dopant concentration on the p collector region 148 side are in the n− drift region 141. The on-state voltage Von can be reduced as the number of bipolar carrier injected into the n− drift region 141 increases. However, with a larger number of bipolar carriers injected into the n− drift region 141, the time to reach a state of equilibrium is elongated, and a turn-on loss Eon is increased. Thus, a trade-off relationship is established between the on-state voltage Von and the turn-on loss Eon.

On the other hand, when the voltage applied to the gate electrode 146 is made not higher than the threshold value in the continuity state, the bipolar carriers in the n− drift region 141 move from the n− drift region 141 to the other regions. Thus, an electron barrier is formed between the n− drift region 141 and the n+ emitter region 143 so as to block a current (current blocking state). A turn-off loss Eoff is generated during the process in which the bipolar carriers in the n− drift region 141 are ejected to change over from the continuity state to the current blocking state. Thus, a trade-off relationship is established between the on-state voltage Von and the turn-off loss Eoff.

Also in the aforementioned FWD (FIG. 35), the on-state voltage Von is reduced due to conductivity modulation in the n− drift region 151 caused by the carrier injection into the n− drift region 151 in the continuity state. As a result, a forward voltage VF is lowered. On the other hand, during the process in which the carriers injected into the n− drift region 151 are ejected from the n− drift region 151 to change over to a reverse recovery state, a reverse recovery loss Err increases as the number of carriers injected into the n− drift region 151 is larger. Thus, a trade-off relationship is established between the forward voltage VF and the reverse recovery loss Err.

In the aforementioned A-NPC circuit shown in FIG. 33, the FWDs 103 and 104 of the main switch 100 are brought into the reverse recovery state when the RB-IGBTs 131 and 132 (or the IGBTs 111 and 112 in the A-NPC circuit shown in FIG. 32) turn on. On the other hand, when the RB-IGBTs 131 and 132 engage in reverse recovery in a diode mode (or the FWDs 113 and 114 in the A-NPC circuit shown in FIG. 32 engage in reverse recovery), the IGBTs 101 and 102 constituting the main switch 100 turn on.

Thus, in order to suppress the total electric loss in the A-NPC circuit shown in FIG. 33, it is necessary to reduce not only the turn-off loss Eoff of the RB-IGBTs 131 and 132 (or the IGBTs 111 and 112 shown in FIG. 32) but also the reverse recovery loss Err of the RB-IGBTs 131 and 132 in the diode mode (or the FWDs 113 and 114 shown in FIG. 32), the turn-on loss Eon of the IGBTs 101 and 102 constituting the main switch 100, the turn-on loss Eon of the RB-IGBTs 131 and 132 (or the IGBTs 111 and 112 shown in FIG. 32), and the reverse recovery loss Err of the FWDs 103 and 104 of the main switch 100.

An FS (Field Stop) structure is publicly known as a low-loss IGBT. In the FS structure, an n− drift region is thinner than in an NPT (Non Punch Through) structure in which a depletion layer extended from the emitter side does not reach the collector side in the off state, and an n region with a higher impurity concentration than the n− drift region is provided on the collector side. An FS-IGBT (Field Stop IGBT) has characteristics in that the number of holes injected from the collector to the n− drift region is small, and the carrier life time of the n− drift region is long. Thus, both low on-state voltage and low switching loss (turn-on loss and turn-off loss) can be achieved.

A typical FWD has characteristics in that the thickness of the n− drift region 151 is small, the number of holes injected from the p anode region 154 is small, and the carrier life time of the n− drift region 151 is short. Thus, both a soft recovery property and low reverse recovery loss can be achieved.

However, in the A-NPC circuit using the RB-IGBTs 131 and 132 as shown in FIG. 33, there is a problem that the total electric loss of the A-NPC circuit increases. The reason is as follows. A typical RB-IGBT has an NPT structure having a thicker drift region than in an FS structure in order to make the forward breakdown voltage and the reverse breakdown voltage compatible. In addition, in the RB-IGBT, a collector region with a comparatively high concentration is formed to prevent the depletion layer extending from the emitter side from being punched through on the collector side when a reverse voltage is applied. Thus, the number of holes injected from the collector side to the drift region increases. In addition, in the RB-IGBT, the carrier life time of the drift region is adjusted to be short enough to suppress the switching loss (the turn-off loss Eoff, the turn-on loss Eon, and the reverse recovery loss Err).

That is, the RB-IGBT does not have the aforementioned characteristic as FS-IGBT or FWD. Thus, when the A-NPC circuit is operated by a related-art driving method so as to bring the RB-IGBTs 131 and 132 into reverse recovery in a diode mode, there occurs a problem that the peak of a reverse recovery current $I_{AK}$ (hereinafter referred to as "reverse recovery current peak Irp") increases (hard recovery), the peak of a jump voltage $V_{AK}$ (hereinafter referred to as "jump voltage peak Vrp") increases due to oscillation, and the reverse recovery loss increases. Further, there occurs a problem that the turn-on loss Eon of the IGBTs 101 and 102 constituting the main switch 100 also increases. Thus, the total electric loss of the A-NPC circuit increases due to the increasing electric loss in the RB-IGBTs 131 and 132 and the IGBTs 101 and 102.

SUMMARY OF THE INVENTION

In order to solve the foregoing problems belonging to the related art, an object of the invention is to provide a low-loss semiconductor device, a method for manufacturing the semiconductor device, and a method for controlling the semiconductor device.

In order to solve the foregoing problems and attain the object of the invention, a semiconductor device according to the invention has characteristics as follows. A second semiconductor region of a second conductivity type is selectively provided in a surface layer of one side of a first semiconductor region of a first conductivity type. A third semiconductor region of the first conductivity type is selectively provided inside the second semiconductor region. A gate electrode is provided in a surface of a portion of the second semiconductor region which is located between the first semiconductor region and the third semiconductor region while a gate insulating film is put between the gate electrode and the second semiconductor region. A fourth semiconductor region of the second conductivity type is provided on the other side of the first semiconductor region. A low life time region which is shorter in carrier life time than any other region is provided in an interface between the first semiconductor region and the fourth semiconductor region. A fifth semiconductor region of the second conductivity type is provided in an outer circumferential portion of the first semiconductor region so as to penetrate the first semiconductor region and the lowlife time region on the one side of the first semiconductor region and reach the fourth semiconductor region. A first electrode is provided to touch the second semiconductor region and the third semiconductor region. A second electrode is provided to touch the fourth semiconductor region. The first semiconductor region is set to have a predetermined carrier life time by light ion irradiation for elongating the carrier life time.

In addition, in order to solve the foregoing problems and attain the object of the invention, a semiconductor device according to the invention has characteristics as follows. A second semiconductor region of a second conductivity type is selectively provided in a surface layer of one side of a first semiconductor region of a first conductivity type. A third semiconductor region of the first conductivity type is selectively provided inside the second semiconductor region. A trench is provided to penetrate the second semiconductor region and the third semiconductor region and reach the first semiconductor region. A gate insulating film is provided inside the trench and along an inner wall of the trench. A gate electrode is provided inside the trench and on an inner side of the gate insulating film. A fourth semiconductor region of the second conductivity type is provided on the other side of the first semiconductor region. A low life time region which is shorter in carrier life time than any other region is provided in an interface between the first semiconductor region and the fourth semiconductor region. A fifth semiconductor region of the second conductivity type is provided in an outer circumferential portion of the first semiconductor region so as to penetrate the first semiconductor region and the lowlife time region on the one side of the first semiconductor region and reach the fourth semiconductor region. A first electrode is provided to touch the second semiconductor region and the third semiconductor region. A second electrode is provided to touch the fourth semiconductor region. The first semiconductor region is set to have a predetermined carrier life time by light ion irradiation for elongating the carrier life time.

In addition, according to the invention, there is provided a semiconductor device in the aforementioned configuration, wherein: the light ion irradiation is carried out at acceleration energy from 4 MeV to 6 MeV and dose from 10 kGry to 30 kGry.

In addition, according to the invention, there is provided a semiconductor device in the aforementioned configuration, wherein: the first semiconductor region is set at the predetermined carrier life time by the light ion irradiation and annealing which is performed at temperature from 320° C. to 340° C. for 50 minutes to 70 minutes after the light ion irradiation.

In addition, in order to solve the foregoing problems and attain the object of the invention, the semiconductor device according to the invention is a semiconductor device including a second semiconductor element which is electrically connected to an intermediate potential point between a high potential point and a low potential point of a first semiconductor element. The semiconductor device includes the first semiconductor element, the second semiconductor element and a control unit for controlling the first semiconductor element and the second semiconductor element and has characteristics as follows. The second semiconductor element includes a first semiconductor region of a first conductivity type, a second semiconductor region of a second conductivity type which is selectively provided in a surface layer of one side of the first semiconductor region, a third semiconductor region of the first conductivity type which is selectively provided inside the second semiconductor region, a gate electrode which is provided in a surface of a portion of the second semiconductor region which is located between the first semiconductor region and the third semiconductor region, agate insulating film being put between the gate electrode and the second semiconductor region, a fourth semiconductor region of the second conductivity type which is provided on the other side of the first semiconductor region, a lowlife time region which is provided in an interface between the first semiconductor region and the fourth semiconductor region and which is shorter in carrier life time than any other region, a fifth semiconductor region of the second conductivity type which is provided in an outer circumferential portion of the first semiconductor region so as to penetrate the first semiconductor region and the low life time region on the one side of the first semiconductor region and reach the fourth semiconductor region, a first electrode which touches the second semiconductor region and the third semiconductor region, and a second electrode which touches the fourth semiconductor region. The control unit turns on the first semiconductor element in order to bring the second semiconductor element into reverse recovery, and makes a variation of a current flowing in a turn-on state of the first semiconductor element smaller than 0.8 kA/µs.

In addition, in order to solve the foregoing problems and attain the object of the invention, the semiconductor device according to the invention is a semiconductor device including a second semiconductor element which is electrically connected to an intermediate potential point between a high potential point and a low potential point of a first semiconductor element. The semiconductor device includes the first semiconductor element, the second semiconductor element and a control unit for controlling the first semiconductor element and the second semiconductor element and has characteristics as follows. The second semiconductor element includes a first semiconductor region of a first conductivity type, a second semiconductor region of a second conductivity type which is selectively provided in a surface layer of one side of the first semiconductor region, a third semiconductor region of the first conductivity type which is selectively provided inside the second semiconductor region, a trench which penetrates the second semiconductor region and the third semiconductor region and reaches the first semiconductor region, a gate insulating film which is provided inside the trench and along an inner wall of the trench, a gate electrode which is provided inside the trench and on an inner side of the gate insulating film, a fourth semiconductor region of the second conductivity type which is provided on the other side of the first semiconductor region, a lowlife time region which is provided in an interface between the first semiconductor region and the fourth semiconductor region and which is shorter in carrier life time than any other region, a fifth semiconductor region of the second conductivity type which is provided in an outer circumferential portion of the first semiconductor region so as to penetrate the first semiconductor region and the low life time region on the one side of the first semiconductor region and reach the fourth semiconductor region, a first electrode which touches the second semiconductor region and the third semiconductor region, and a second electrode which touches the fourth semiconductor region. The control unit turns on the first semiconductor element in order to bring the second semiconductor element into reverse recovery, and makes a variation of a current flowing in a turn-on state of the first semiconductor element smaller than 0.8 kA/µs.

In addition, according to the invention, there is provided a semiconductor device in the aforementioned configuration, further including: a groove which is provided in an outer circumferential portion of the first semiconductor region and on the other side of the first semiconductor region; wherein: the fourth semiconductor region is provided along an inner wall of the groove on the other side of the first semiconductor region; and the fifth semiconductor region is provided to extend from the one side of the first semiconductor region and reach the groove.

In addition, according to the invention, there is provided a semiconductor device in the aforementioned configuration, wherein: the first semiconductor region is 250 µm to 290 µm thick.

In addition, in order to solve the foregoing problems and attain the object of the invention, the method for manufacturing a semiconductor device according to the invention is a method for manufacturing a semiconductor device including a first conductivity type semiconductor region, a metal/oxide film/semiconductor insulating gate structure which is provided on one side of the first conductivity type semiconductor region, a first second conductivity type semiconductor region which is provided on the other side of the first conductivity type semiconductor region, a low life time region which is provided in an interface between the first conductivity type semiconductor region and the first second conductivity type semiconductor region and which is shorter in carrier life time than any other region, a second second conductivity type semiconductor region which is provided in an outer circumferential portion of the first conductivity type semiconductor region so as to penetrate the first conductivity type semiconductor region and the low life time region on the one side of the first conductivity type semiconductor region and reach the first second conductivity type semiconductor region, and an output electrode which touches the first second conductivity type semiconductor region. The method for manufacturing the semiconductor device has characteristics as follows. First, a first step is carried out to selectively form the second second conductivity type semiconductor region in the outer circumferential portion of the first conductivity type semiconductor region at a determined depth from one main surface of the first conductivity type semiconductor region. Next, after the first step, a second step is carried out to form the insulating gate structure on the one main surface side of the first conductivity type semiconductor region. Next, after the second step, a third step is carried out to carry out light ion irradiation for elongating carrier life time so as to set the first conductivity type semiconductor region at a predetermined carrier life time. Next, after the third step, a fourth step is carried out to form the first second conductivity type semiconductor region on the other main surface of the first conductivity type semiconductor region so that the first second conductivity type semiconductor region can touch the second conductivity type semiconductor region.

In addition, according to the invention, there is provided a method for manufacturing a semiconductor device in the aforementioned configuration, wherein: the light ion irradiation is carried out at acceleration energy from 4 MeV to 6 MeV and dose from 10 kGry to 30 kGry in the third step.

In addition, according to the invention, there is provided a method for manufacturing a semiconductor device in the aforementioned configuration, wherein: annealing is performed at temperature from 320° C. to 340° C. for 50 minutes to 70 minutes after the light ion irradiation in the third step.

In addition, in order to solve the foregoing problems and attain the object of the invention, the method for controlling a semiconductor device according to the invention is a method for controlling a semiconductor device including a second semiconductor element which is electrically connected to an intermediate potential point between a high potential point and a low potential point of a first semiconductor element. The method for controlling a semiconductor device has characteristics as follows. The second semiconductor element includes a first semiconductor region of a first conductivity type, a second semiconductor region of a second conductivity type which is selectively provided in a surface layer of one side of the first semiconductor region, a third semiconductor region of the first conductivity type which is selectively provided inside the second semiconductor region, a gate electrode which is provided in a surface of a portion of the second semiconductor region which is located between the first semiconductor region and the third semiconductor region, agate insulating film being put between the gate electrode and the second semiconductor region, a fourth semiconductor region of the second conductivity type which is provided on the other side of the first semiconductor region, a lowlife time region which is provided in an interface between the first semiconductor region and the fourth semiconductor region and which is shorter in carrier life time than any other region, a fifth semiconductor region of the second conductivity type which is provided in an outer circumferential portion of the first semiconductor region so as to penetrate the first semiconductor region and the low life time region on the one side of the first semiconductor region and reach the fourth semiconductor region, a first electrode which touches the second semiconductor region and the third semiconductor region, and a second electrode which touches the fourth semiconductor region. The first semiconductor element is turned on in order to bring the second semiconductor element into reverse recovery, and a variation of a current flowing in a turn-on state of the first semiconductor element is made smaller than 0.8 kA/μs.

In addition, in order to solve the foregoing problems and attain the object of the invention, the method for controlling a semiconductor device according to the invention is a method for controlling a semiconductor device including a second semiconductor element which is electrically connected to an intermediate potential point between a high potential point and a low potential point of a first semiconductor element. The method for controlling a semiconductor device has characteristics as follows. The second semiconductor element includes a first semiconductor region of a first conductivity type, a second semiconductor region of a second conductivity type which is selectively provided in a surface layer of one side of the first semiconductor region, a third semiconductor region of the first conductivity type which is selectively provided inside the second semiconductor region, a trench which penetrates the second semiconductor region and the third semiconductor region and reaches the first semiconductor region, a gate insulating film which is provided inside the trench and along an inner wall of the trench, a gate electrode which is provided inside the trench and on an inner side of the gate insulating film, a fourth semiconductor region of the second conductivity type which is provided on the other side of the first semiconductor region, a lowlife time region which is provided in an interface between the first semiconductor region and the fourth semiconductor region and which is shorter in carrier life time than any other region, a fifth semiconductor region of the second conductivity type which is provided in an outer circumferential portion of the first semiconductor region so as to penetrate the first semiconductor region and the low life time region on the one side of the first semiconductor region and reach the fourth semiconductor region, a first electrode which touches the second semiconductor region and the third semiconductor region, and a second electrode which touches the fourth semiconductor region. The first semiconductor element is turned on in order to bring the second semiconductor element into reverse recovery, and a variation of a current flowing in a turn-on state of the first semiconductor element is made smaller than 0.8 kA/μs.

According to the aforementioned invention, when the second semiconductor element (RB-IGBT) is brought into reverse recovery, turn-on di/dt of the first semiconductor element (IGBT) whose collector or emitter is connected to the collector or emitter of the second semiconductor element is made smaller than 0.8 kA/μs. Thus, it is possible to suppress the peak of a reverse recovery current and the peak of a jump voltage during the reverse recovery, while it is possible to reduce the reverse recovery loss.

According to a semiconductor device, a method for manufacturing the semiconductor device and a method for controlling the semiconductor device according to the invention, there is an effect that it is possible to provide a low-loss semiconductor device.

BRIEF DESCRIPTION OF THE DRAWINGS

FIG. 22 is a table showing measured values in the respective characteristics in FIGS. 20 and 21;

DETAILED DESCRIPTION

Embodiments of a semiconductor device, a method for manufacturing the semiconductor device and a method for controlling the semiconductor device according to the invention will be described below in detail with reference to the accompanying drawings. In this specification and the accompanying drawings, a prefix n or p added to a layer or region means that electrons or positive holes are major carriers in the layer or region. In addition, a suffix + or − added to the prefix n or p means that a layer or region with the suffix + or − is higher or lower in impurity concentration than a layer or region without any suffix + or −. In the following description of embodiments and the accompanying drawings, similar configurations are referred to by the same numerals correspondingly, and redundant description will be omitted.

Embodiment 1

Figure 1:
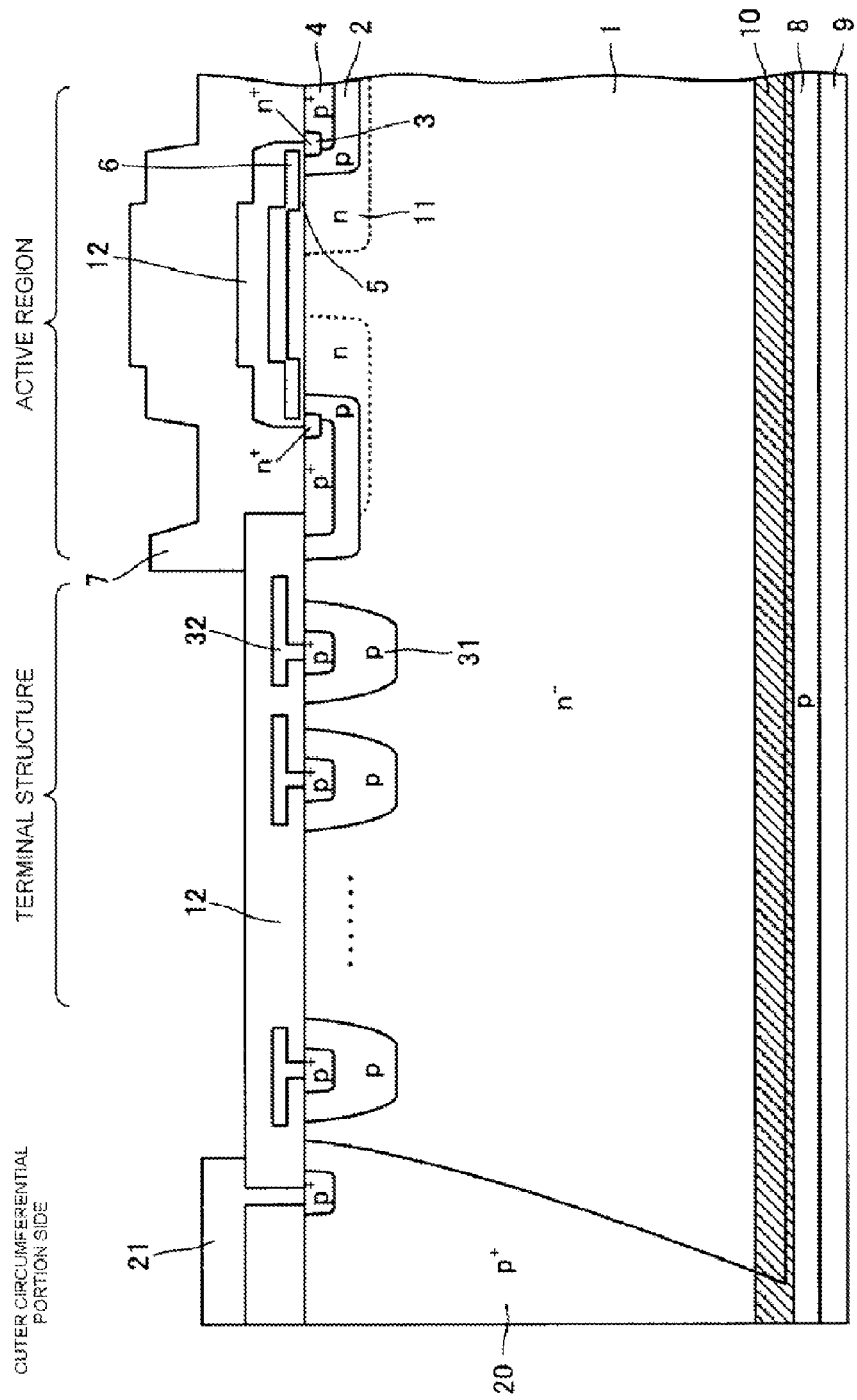
FIG. 1 is a sectional view showing the configuration of a semiconductor device according to a first non-limiting illustrative embodiment ("Embodiment 1")

FIG. 1 is a sectional view showing the configuration of a semiconductor device according to Embodiment 1. The semiconductor device according to Embodiment 1 shown in FIG. 1 is an RB-IGBT which has a planar gate type MOS gate (insulated gate consisting of metal/oxide film/semiconductor) structure. As shown in FIG. 1, the semiconductor device according to Embodiment 1 has an active region and a terminal structure portion in an $n^-$ drift region (first semiconductor region) 1 consisting of an $n^-$ type semiconductor substrate (chip). A drift current flows into the active region which is surrounded by the terminal structure portion. The $n^-$ drift region 1 has a comparatively long carrier life time as compared with a typical device of an NPT structure. In the active region, a p base region (second semiconductor region) 2 is selectively provided in a surface layer of one side of the $n^-$ drift region 1.

An n region 11 is provided between the $n^-$ drift region 1 and the p base region 2. The n region 11 covers the p base region 2 on the $n^-$ drift region 1 side. An $n^+$ emitter region (third semiconductor region) 3 and a $p^+$ contact region 4 are selectively provided inside the p base region 2. A gate electrode 6 is provided on the surface of a portion of the p base region 2 which is put between the $n^-$ drift region 1 and the $n^+$ emitter region 3, while a gate insulating film 5 is disposed between the p base region 2 and the gate electrode 6. An emitter electrode (first electrode) 7 touches the $n^+$ emitter region 3 and the $p^+$ contact region 4 so as to short-circuit the $n^+$ emitter region 3 with the $p^+$ contact region 4. In addition, the emitter electrode 7 is electrically isolated from the gate electrode 6 by an interlayer insulating film (BPSG: Boron Phosphor Silicate Glass) 12.

A p collector region (fourth semiconductor region) 8 is provided in a surface layer of the other side of the $n^-$ drift region 1 so as to extend over all of the other side of the $n^-$ drift region 1. A collector electrode (second electrode) 9 touches the whole surface of the p collector region 8. A region (hereinafter referred to as "low life time region") 10 in which the life time of carriers is shorter than any other region is provided in the interface between the $n^-$ drift region 1 and the p collector region 8. In the low life time region 10, for example, a crystal defect added as a life time killer has been formed by an electron beam or the like. Specifically, the low life time region 10 is provided to spread from the p collector region 8 to the $n^-$ drift region 1 including the interface between the $n^-$ drift region 1 and the p collector region 8.

In addition, the low life time region 10 is a region whose activation ratio is lower than the p collector region 8. Thus, p-type impurities such as boron injected to form the p collector region 8 are made substantially inactive in the low life time region 10. That is, the low life time region 10 is a region with p-type impurities which have been injected for the purpose of forming the p collector region 8 so as to spread from the interface between the $n^-$ drift region 1 and the p collector region 8 to the $n^-$ drift region 1 side and the p collector region 8 side and which has not been activated.

A $p^+$ isolation region (fifth semiconductor region) 20 is provided in the outer circumferential portion of the $n^-$ drift region 1 so as to penetrate the $n^-$ drift region 1 on one side of the $n^-$ drift region 1 and reach the p collector region 8. That is, a through silicon isolation layer structure in which the p collector region 8 and the $p^+$ isolation region 20 are coupled with each other is provided in the outer circumferential portion of the $n^-$ drift region 1 to surround the active region. The $p^+$ isolation region 20 abuts against the low life time region 10. A field stopper electrode 21 is electrically connected to the $p^+$ isolation region 20. A terminal structure is provided between the $p^+$ isolation region and the active region. The terminal structure is constituted by a floating p region 31 which is selectively provided in one side of the $n^-$ drift region 1, and a field plate electrode 32 which is electrically connected to the p region 31.

Next, a method for driving the semiconductor device according to Embodiment 1 will be described. When the semiconductor device (RB-IGBT: second semiconductor element) according to Embodiment 1 is brought into reverse recovery in a diode mode, the turn-on di/dt of an IGBT (first semiconductor element) constituting a switching device whose intermediate potential depends on the RB-IGBT is made smaller than 0.8 kA/μs. The turn-on di/dt is a variation of a current flowing in the turn-on state of the switching device. In order to make the turn-on di/dt of the IGBT smaller than 0.8 kA/μs, for example, the turn-on rate of the IGBT may be made not higher than 440 A/μm. The semiconductor device (RB-IGBT) according to Embodiment 1 and the IGBT constituting the switching device whose intermediate potential depends on the RB-IGBT are controlled by a not-shown control unit.

Figure 32:
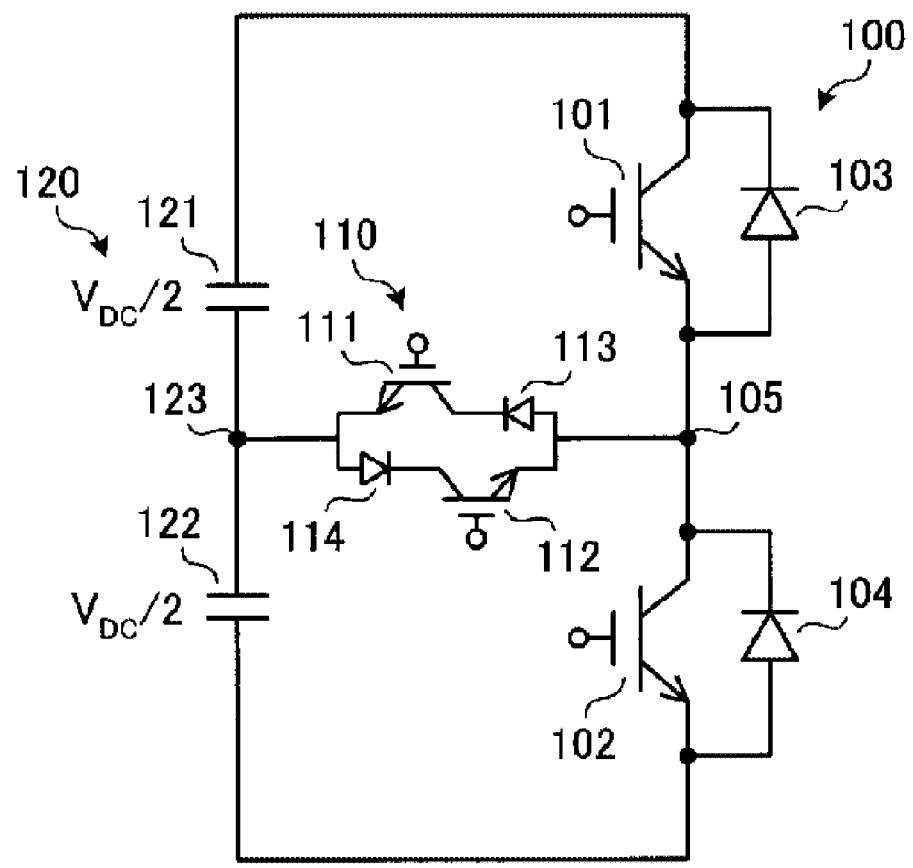
FIG. 32 is a circuit diagram showing the configuration of a typical A-NPC three-level converter.
Figure 33:
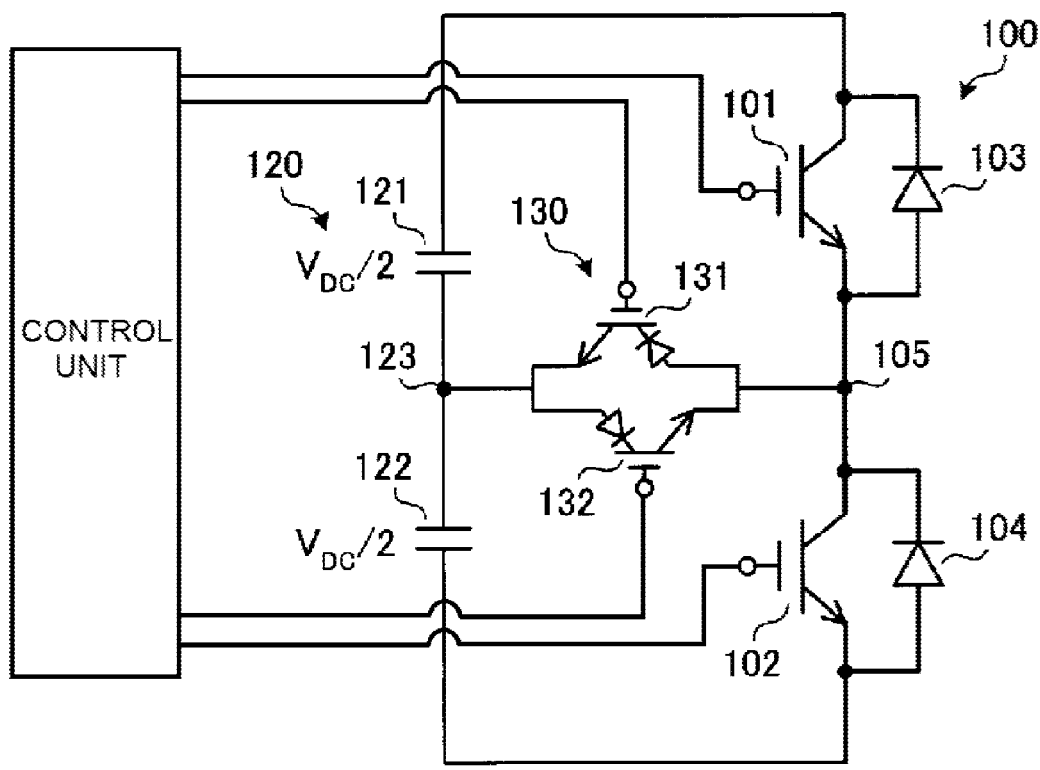
FIG. 33 is a circuit diagram showing the configuration of a typical A-NPC three-level converter.
Figure 34:
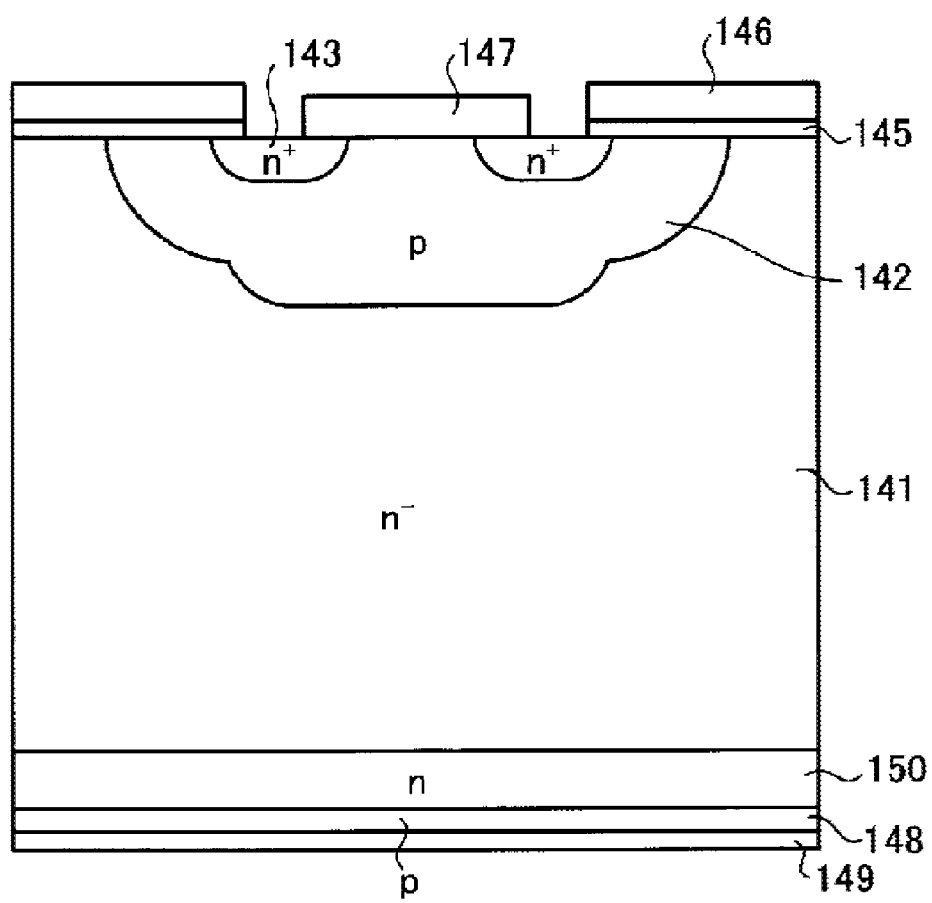
FIG. 34 is a sectional view showing the configuration of an IGBT in the related art.
Figure 35:
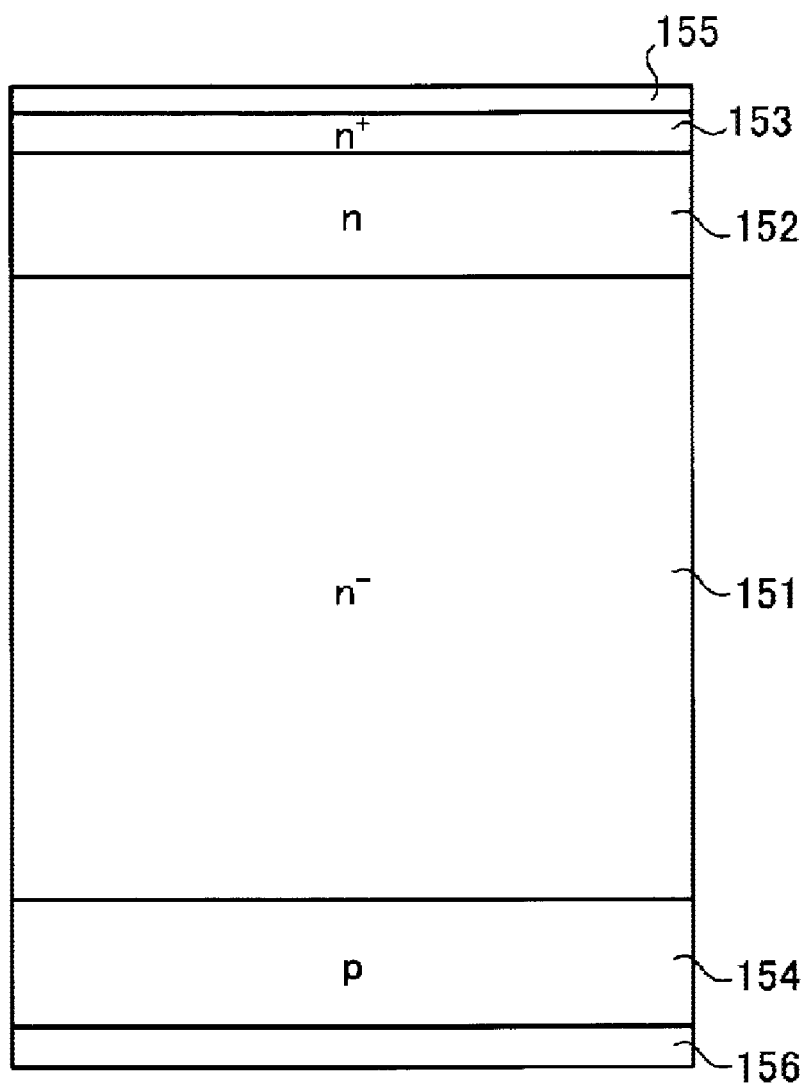
FIG. 35 is a sectional view showing the configuration of an FWD in the related art.
Figure 36:
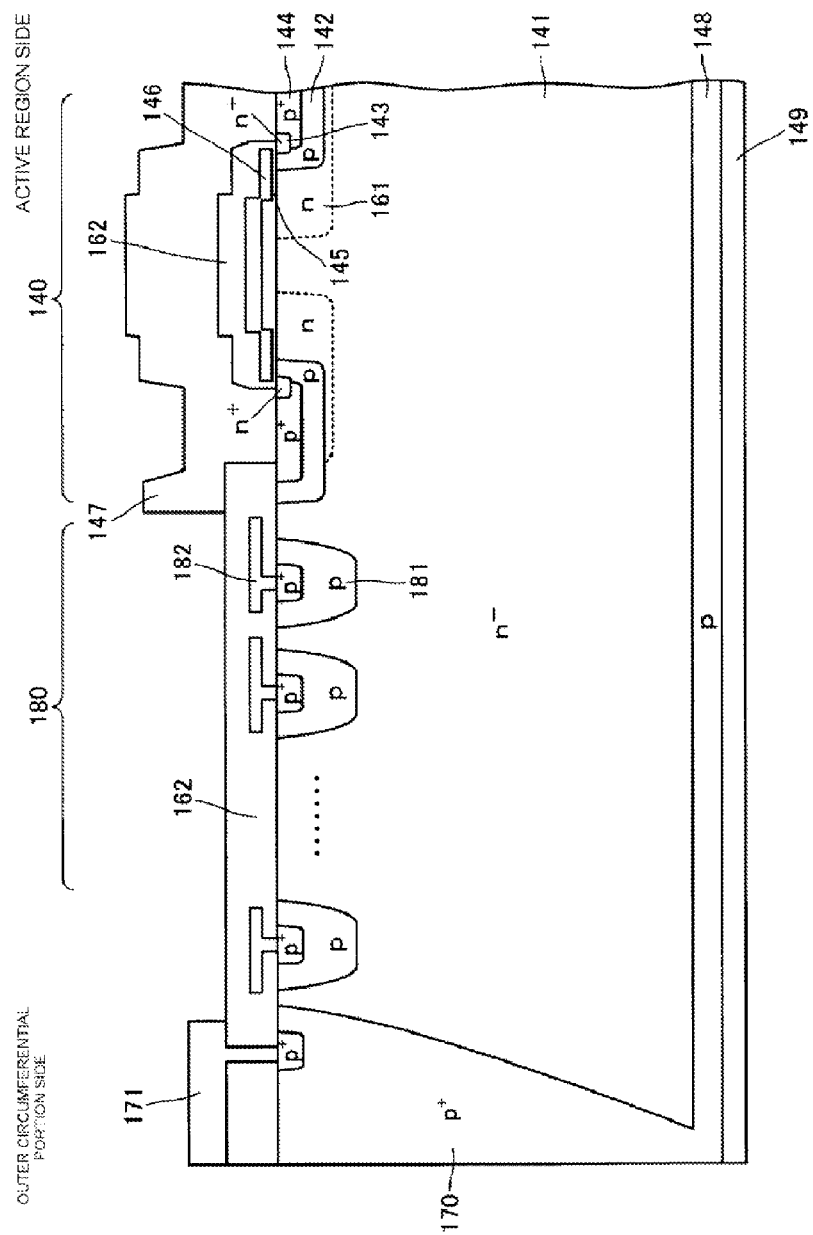
FIG. 36 is a sectional view showing the configuration of an RB-IGBT in the related art.
Figure 37:
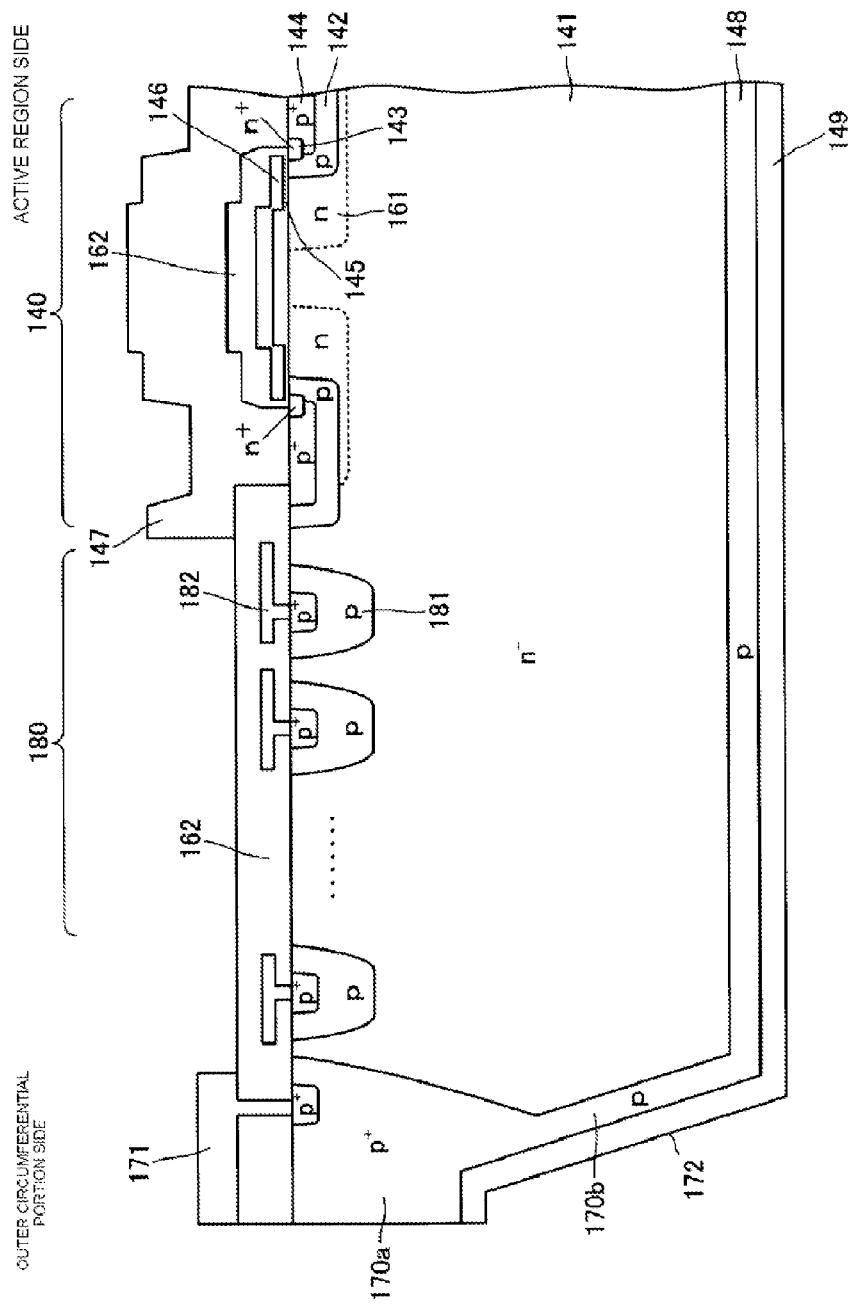
FIG. 37 is a sectional view showing another example of the configuration of an RB-IGBT in the related art.

More specifically, for example, as shown in FIG. 33, two semiconductor devices according to Embodiment 1 are connected in parallel to form a bidirectional switch 130. In the case of an A-NPC circuit (an A-NPC three-level converter) configured in such a manner that the intermediate potential (output point potential at the connection point 105) of the main switch 100 (opposite switching device) is clamped by the bidirectional switch 130, the A-NPC circuit is driven and controlled so that the turn-on di/dt of the IGBTs 101 and 102 (hereinafter referred to as "main IGBT turn-on di/dt") constituting the main switch 100 is made smaller than 0.8 kA/μs. This is because the power loss can be reduced as compared with a related-art A-NPC circuit (FIG. 32) in which the IGBTs 111 and 112 and the FWDs 113 and 114 are combined to form the bidirectional switch 110.

According to Embodiment 1, as described above, when the RB-IGBT is brought into reverse recovery, the turn-on di/dt of the IGBT whose collector or emitter is connected to the collector or emitter of the RB-IGBT is made smaller than 0.8 kA/μs so that the reverse recovery current peak and the jump voltage peak during the reverse recovery can be suppressed, while the reverse recovery loss can be reduced. Thus, the switching loss (power loss) can be reduced, and a low-loss semiconductor device can be provided.

In addition, according to Embodiment 1, the lowlife time region 10 is provided in the interface between the n⁻ drift region 1 and the p collector region 8, and the carrier life time of the n⁻ drift region 1 is made as long as possible by design. Thus, in the turn-on state, injection of minor carriers (holes) from the p collector region 8 to the n⁻ drift region 1 can be suppressed, and the electron transport coefficient in the n⁻ drift region 1 can be increased. Even in an NPT structure, the turn-off loss can be kept at the same level as in the related art.

Embodiment 2

Figure 2:
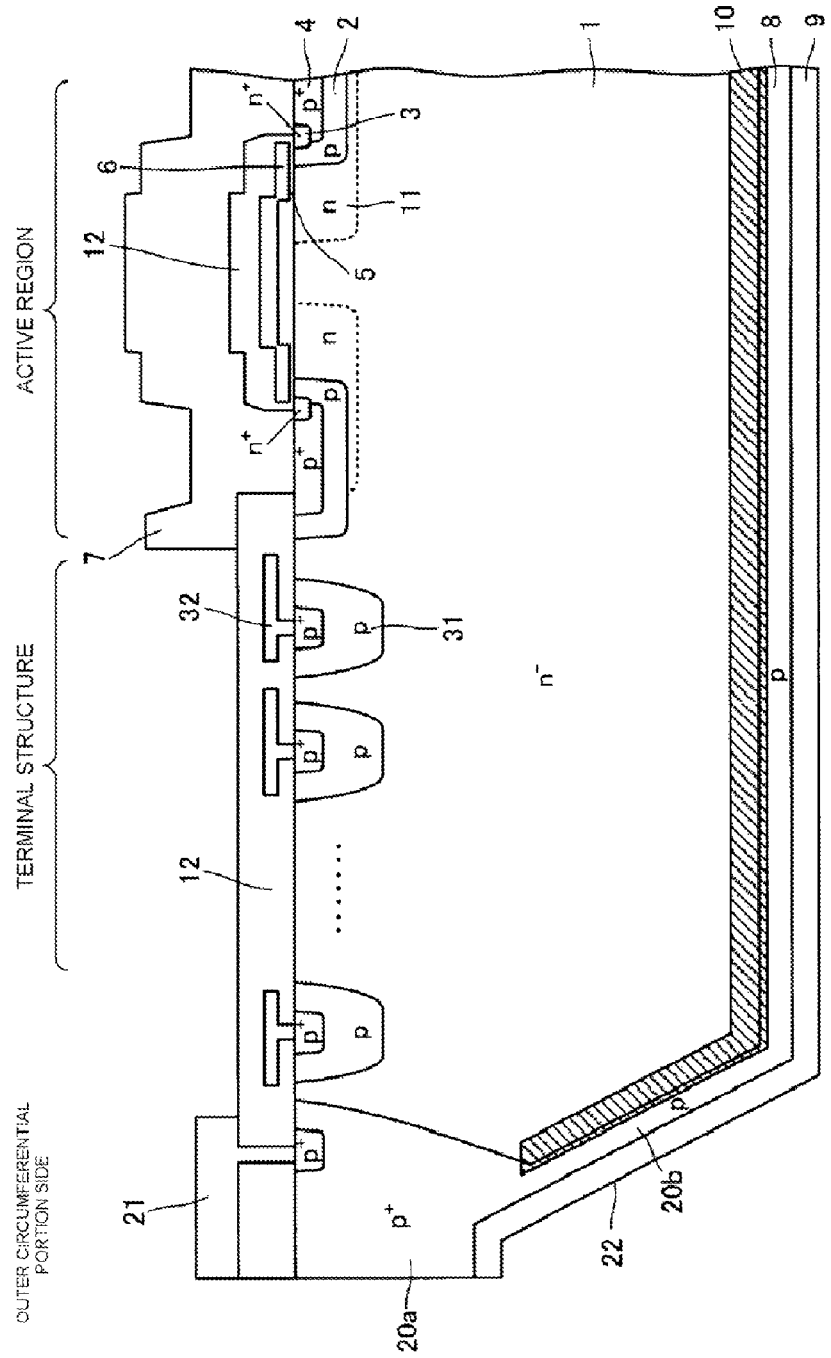
FIG. 2 is a sectional view showing the configuration of a semiconductor device according to a second non-limiting illustrative embodiment ("Embodiment 2")

Next, the configuration of a semiconductor device according to Embodiment 2 will be described. FIG. 2 is a sectional view showing the configuration of a semiconductor device according to Embodiment 2. The semiconductor device according to Embodiment 2 is different from the semiconductor device according to Embodiment 1, in that grooves 22 are provided in the outer circumferential portion of the n⁻ drift region 1, and the thickness of the n⁻ drift region 1 is smaller on the outer circumferential portion side than on the active region side.

Specifically, as shown in FIG. 2, p⁺ isolation regions 20a are provided in the outer circumferential portion of the n⁻ drift region 1 so as to extend from one side of the n⁻ drift region 1 and at a smaller depth than the thickness of the n⁻ drift region 1. In addition, grooves 22 are provided in the outer circumferential portion of the n⁻ drift region 1 so as to extend from the other side of the n⁻ drift region 1 and reach the p⁺ isolation regions 20a respectively. Each groove 22, for example, has a V-shaped sectional shape whose opening width becomes narrower gradually from the other side of the n⁻ drift region 1 toward the p⁺ isolation region 20a. The p collector region 8 is extended to provide a p collector region 20b on the side wall of each groove 22.

The p collector region 20b provided on the side wall of the groove 22 couples the p⁺ isolation region 20a provided on one side of the n⁻ drift region 1 with the p collector region 8 provided on the other side of the n⁻ drift region 1. The low life time region 10 is provided to extend from the interface between the n⁻ drift region 1 and the p collector region 8 to the interface between the n⁻ drift region 1 and the p collector region 20b. The collector electrode 9 is provided to extend from the p collector regions 8 and 20b to the p⁺ isolation region 20a. The other configuration of the RB-IGBT shown in FIG. 2 and the method for driving the same are similar to those of the RB-IGBT shown in FIG. 1.

According to Embodiment 2, as described above, it is possible to obtain similar effects to those of Embodiment 1. In addition, according to Embodiment 2, due to the grooves formed in the outer circumferential portion of the n⁻ drift region, a through silicon isolation layer structure which is shallow in diffusion depth in each p⁺ isolation region can be formed as compared with the case where no groove is formed. Thus, lateral diffusion (diffusion in a direction parallel to the substrate main surface) of the p⁺ isolation region can be prevented from increasing due to thermal diffusion which occurs when the p⁺ isolation region is formed. The surface area of the p⁺ isolation region can be prevented from increasing. The RB-IGBT has an NPT structure including a thicker n⁻ drift region than an FS structure. For example, in a device with breakdown voltage in 1700V class, an n⁻ semiconductor substrate serving as an n⁻ drift region is about 300 μm thick. Therefore, Embodiment 2 is effective.

Embodiment 3

Figure 3:
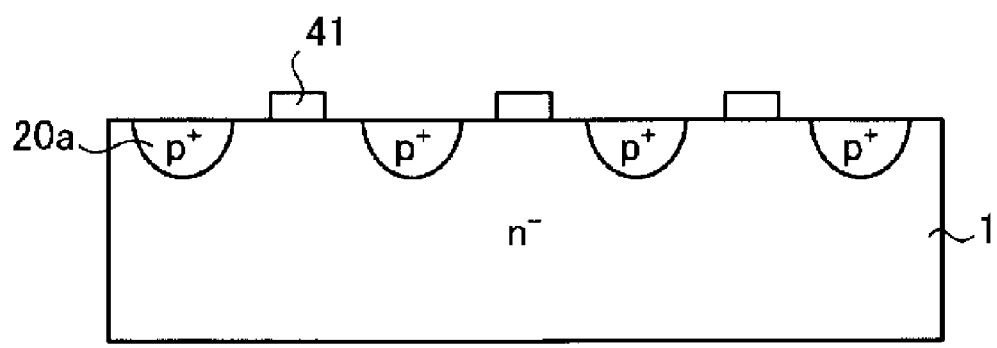
FIG. 3 is a sectional view showing the state in which a semiconductor device is being manufactured according to a third non-limiting illustrative embodiment ("Embodiment 3")
Figure 4:
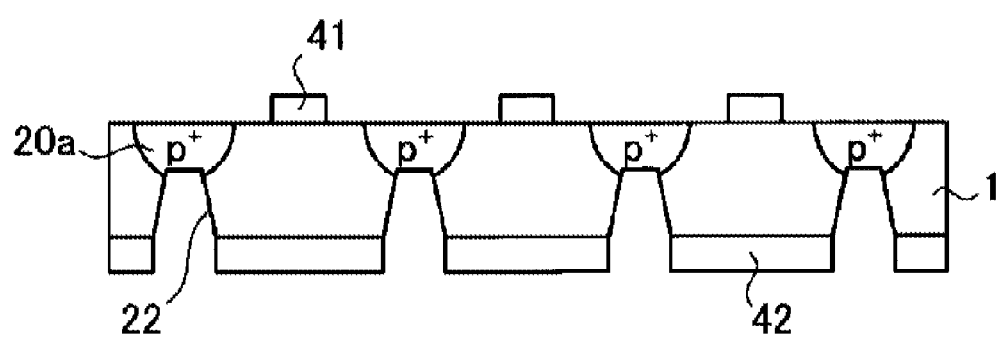
FIG. 4 is a sectional view showing the state in which the semiconductor device is being manufactured according to Embodiment 3.
Figure 5:
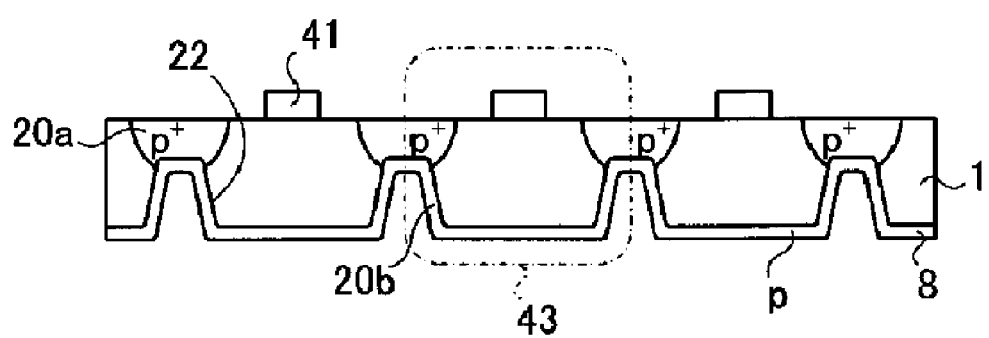
FIG. 5 is a sectional view showing the state in which the semiconductor device is being manufactured according to Embodiment 3.

Next, a method for manufacturing a semiconductor device according to Embodiment 3 will be described in the case in which the semiconductor device according to Embodiment 2 is manufactured by way of example. FIGS. 3 to 5 are sectional views showing the state where the semiconductor device is being manufactured according to Embodiment 3. Here, a wafer is illustrated with the front surface up. However, the face of the wafer is reversed appropriately in each step (the same thing can be applied to FIGS. 6 to 19). First, as shown in FIG. 3, an n⁻ type wafer serving as the n⁻ drift region 1 (hereinafter referred to as "n⁻ type wafer 1") is prepared. Next, the p⁺ isolation regions 20a are selectively formed in the surface layer of the front surface of the n⁻ type wafer 1 by ion injection of p type impurities and thermal diffusion treatment. The depth of each p⁺ isolation region 20a is set to be smaller than the final thickness of the n⁻ type wafer 1.

Next, a front surface element structure 41 is formed in a portion which is located on the front surface side of the n⁻ type wafer 1 and put between adjacent ones of the p⁺ isolation regions 20a. In addition, on the front surface side of the n⁻ type wafer 1, a terminal structure (not shown) which consists of the p region 31 and the field plate electrode 32 or a field stopper electrode (not shown) which electrically abuts against the p⁺ isolation regions 20a is formed together with the front surface element structure 41. The front surface element structure 41 includes the p base region 2, the n⁺ emitter region 3, the p⁺ contact region 4, the MOS gate structure consisting of the gate insulating film 5 and the gate electrode 6, and the emitter electrode 7, which are formed in the active region. A method for forming the front surface element structure 41 will be described later.

Next, as shown in FIG. 4, the back surface of the n⁻ type wafer 1 is ground and thinned down to a desired thickness. Next, a resist mask 42 exposing portions corresponding to the regions where the grooves 22 will be formed is formed in the back surface of the n⁻ type wafer 1 by photolithography. Next, etching is carried out using the resist mask 42 as a mask, so as to form, for example, V-shaped grooves 22 extending from the back surface of the n⁻ type wafer 1 and reaching the p⁺ isolation regions 20a. Next, as shown in FIG. 5, after the resist mask 42 is removed, a p region serving as the p collector regions 8 and 20b is formed by ion injection of p type impurities and thermal diffusion treatment so as to extend from the back surface of the n⁻ type wafer 1 to the inner wall of each groove 22.

The p region formed in the back surface of the n⁻ type wafer 1 and the inner wall of each groove 22 is coupled with the p⁺ isolation region 20a at the bottom of the groove 22. Thus, a through silicon isolation layer structure is formed in a region corresponding to the outer circumferential portion of a chip. Next, a collector electrode (not shown) which abuts against the whole surface of the p region formed in the back surface of the n⁻ type wafer 1 and the inner wall of each groove 22 is formed. Thus, an RB-IGBT 43 is formed in each chip region surrounded by a scribe line which is, for example, located at the center of the p⁺ isolation region 20a and the groove 22. Finally, each chip is separated on the scribe line by dicing. Thus, the RB-IGBT whose configuration is shown in FIG. 2 is completed.

Next, a method for forming the front surface element structure 41 in the method for manufacturing the semiconductor device according to Embodiment 3 will be described. FIGS. 6 to 19 are sectional views showing the state where the semiconductor device is being manufactured according to Embodiment 3. FIGS. 6 to 19 depict a part of the n⁻ type wafer 1 (n⁻ type wafer serving as the n⁻ drift region 1). First, the p⁺ isolation regions 20a are formed on the front surface side of the n⁻ type wafer 1 as described above (FIG. 3). Next, in the region where the terminal structure will be formed, a floating p region (not shown) is formed in the surface layer on the front surface side of the n⁻ type wafer 1 by ion injection and thermal diffusion treatment. Next, active region portions of an oxide film (not shown) formed on the front surface of the n⁻ type wafer 1 by the formation of the floating p region are removed.

Figure 6:
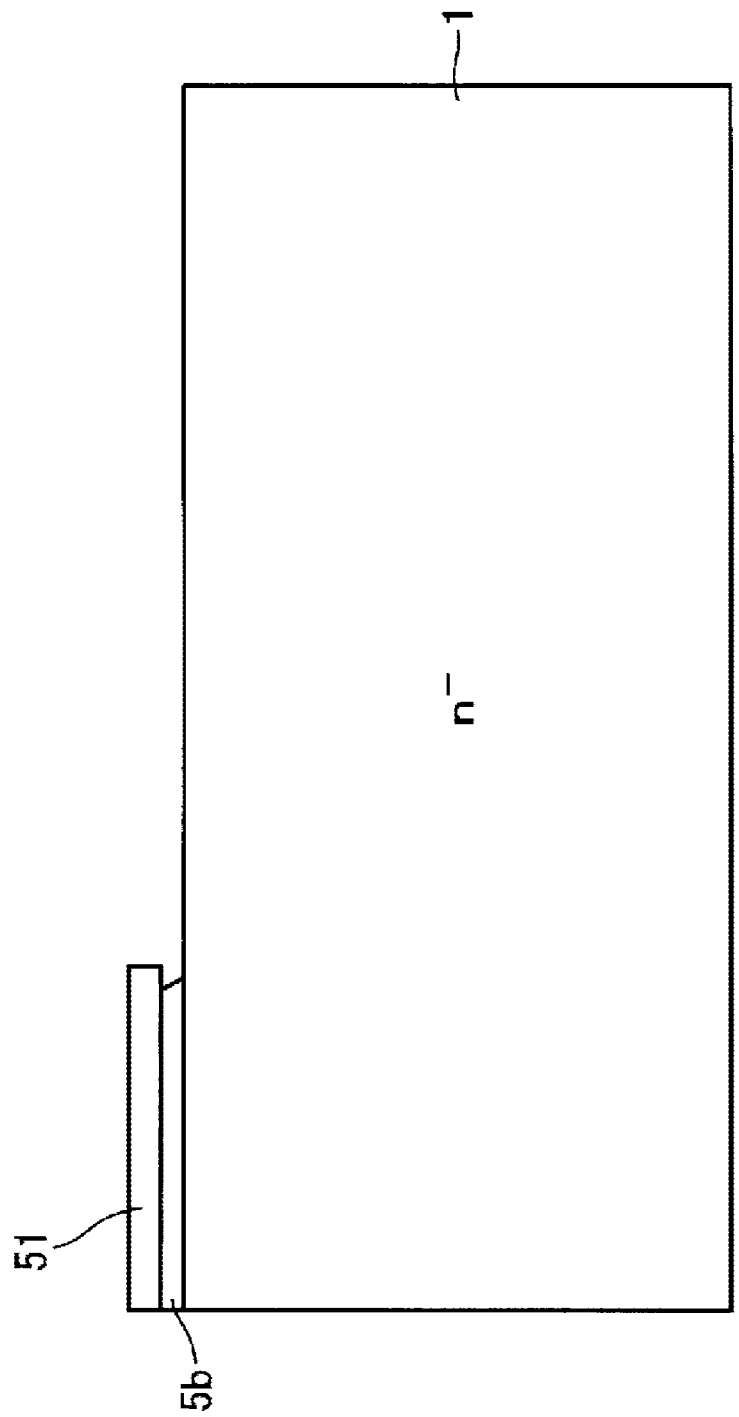
FIG. 6 is a sectional view showing the state in which the semiconductor device is being manufactured according to Embodiment 3.

Next, as shown in FIG. 6, a thermal oxide film 5b is grown up on the front surface of the n⁻ type wafer 1. Next, a resist mask 51 which is opened to expose the thermal oxide film 5b partially is formed on the surface of the thermal oxide film 5b by photolithography. Next, etching is carried out using the resist mask 51 as a mask to remove the portion of the thermal oxide film 5b which is exposed in the opening portion of the resist mask 51. Here, either wet etching may be used or dry etching may be used in the etching process (the same thing will be applied to the following thermal oxide film etching processes). Next, the resist mask 51 is removed, and the n⁻ type wafer 1 is washed.

Figure 7:
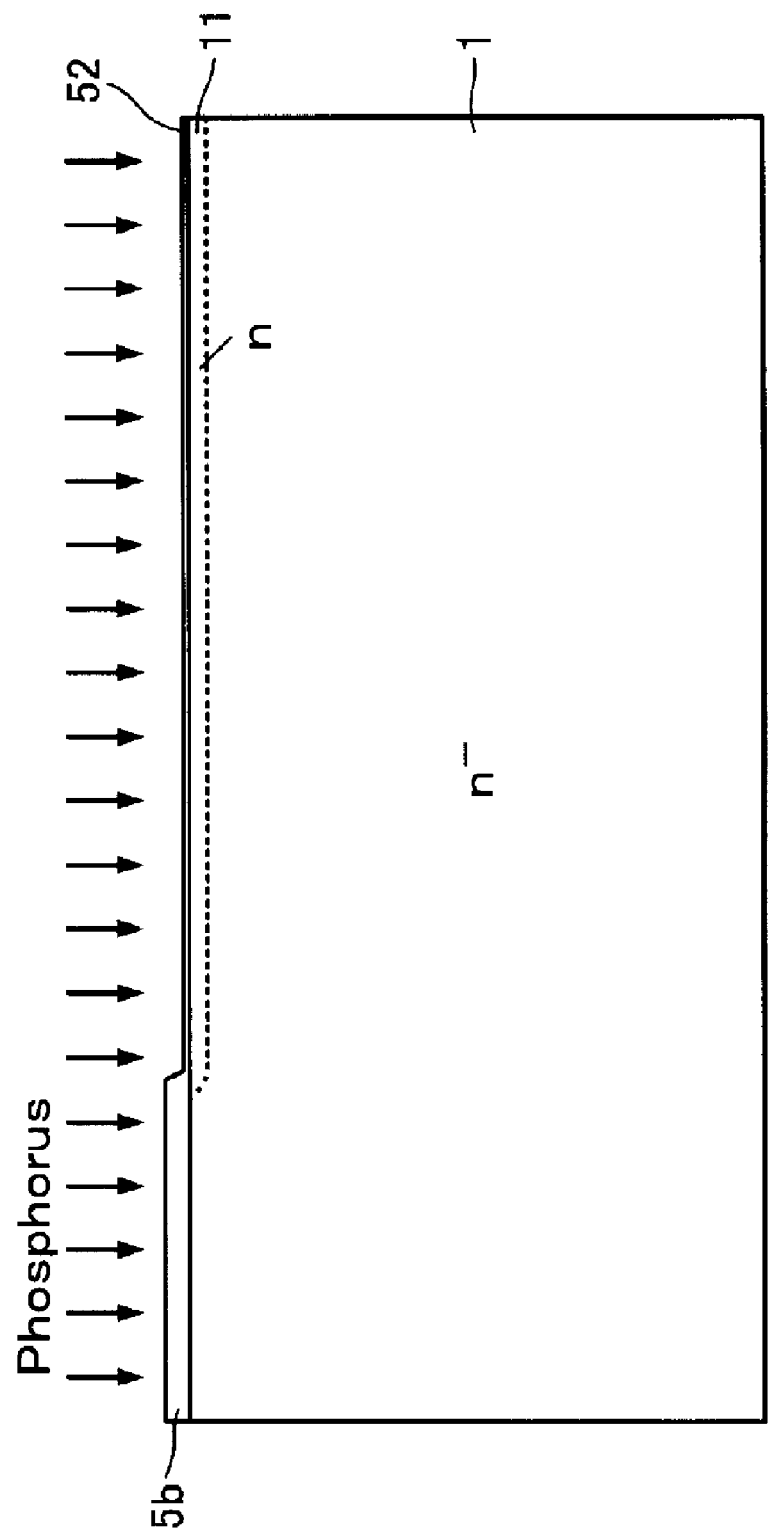
FIG. 7 is a sectional view showing the state in which the semiconductor device is being manufactured according to Embodiment 3.
Figure 8:
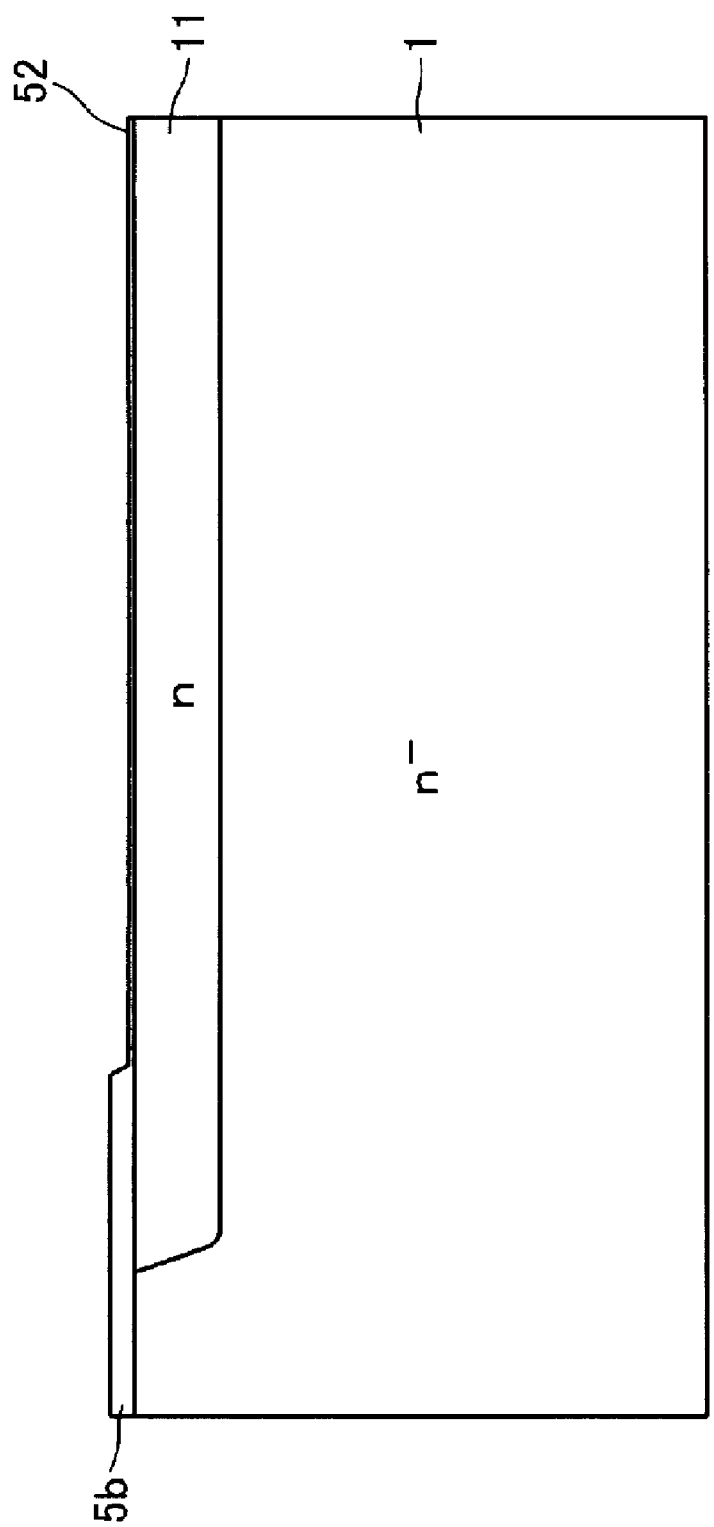
FIG. 8 is a sectional view showing the state in which the semiconductor device is being manufactured according to Embodiment 3.

Next, as shown in FIG. 7, a screen oxide film 52 is grown up on the front surface of the n⁻ type wafer 1. Next, n type impurities such as phosphor (P) are ion-injected to the front surface of the n⁻ type wafer 1 from above the screen oxide film 52. The ion injection may be carried out, for example, at acceleration energy about 100 keV and dose not lower than $1.0\times10^{12}$ cm$^{-2}$ and not higher than $1.5\times10^{12}$ cm$^{-2}$. Next, as shown in FIG. 8, the n type impurities injected into the n⁻ type wafer 1 are diffused by thermal diffusion treatment. The thermal diffusion treatment may be carried out, for example, at 1,150° C. for 5 hours under an inactive gas atmosphere.

Thus, the n region 11 is formed with a predetermined diffusion depth in the surface layer of the portion of the front surface of the n⁻ type wafer 1 which is not covered with the thermal oxide film 5b.

Figure 9:
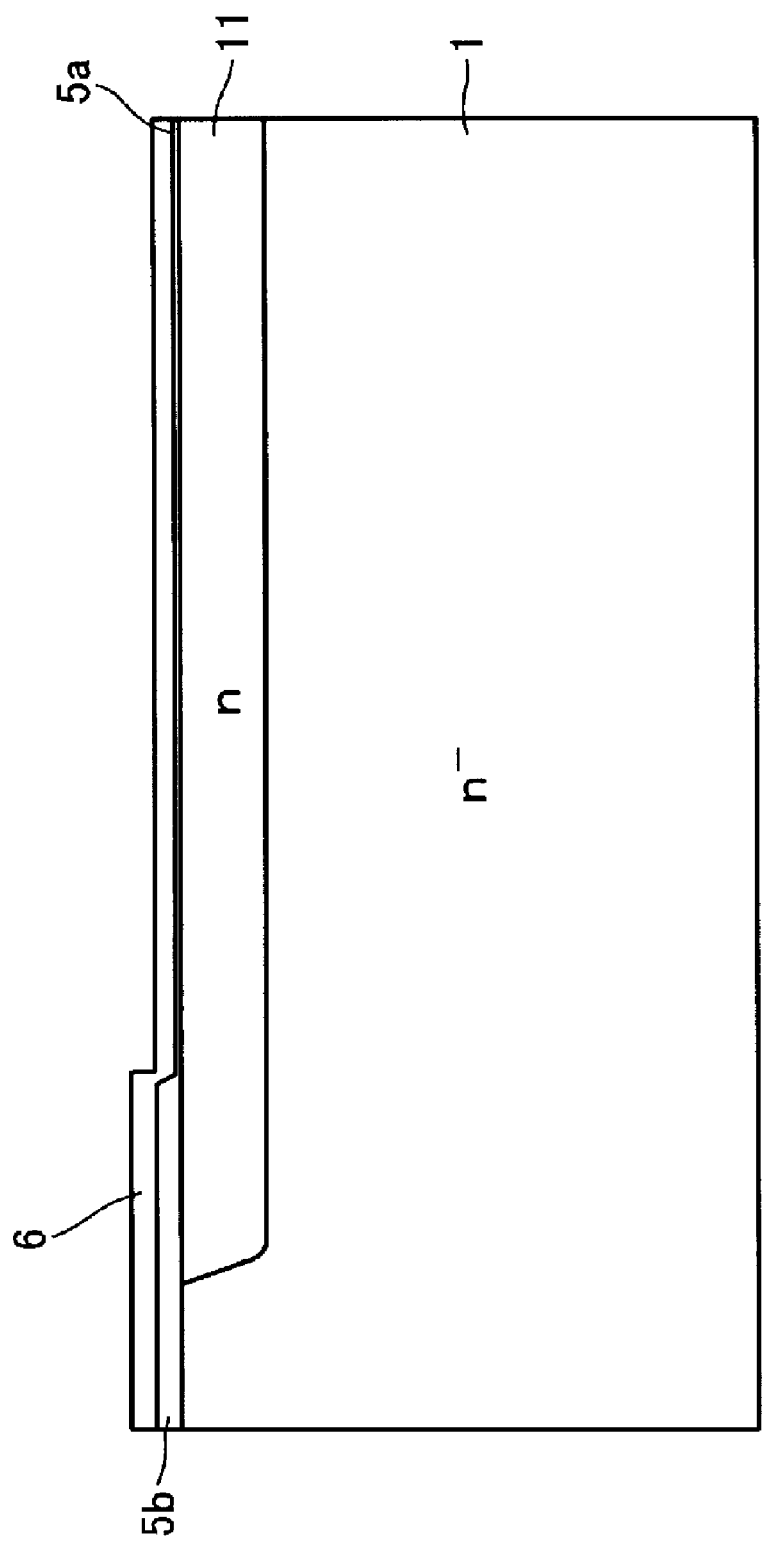
FIG. 9 is a sectional view showing the state in which the semiconductor device is being manufactured according to Embodiment 3.

Next, as shown in FIG. 9, the oxide film is removed to expose silicon in the front surface of the n⁻ type wafer 1, for example, by wet etching. Thus, the screen oxide film 52 is removed. Next, a thermal oxide film 5a is grown up on the front surface of the n⁻ type wafer 1 so as to abut against the thermal oxide film 5b. The thermal oxide films 5a and 5b serve as gate insulating films (hereinafter referred to as "gate insulating films 5a and 5b). Next, an n-type low-resistivity polysilicon layer serving as the gate electrode 6 is deposited all over the front surface of the n⁻ type wafer 1, that is, on the gate insulating films 5a and 5b. The thickness of the polysilicon layer may be, for example, not smaller than 0.4 µm and not larger than 0.8 µm.

Figure 10:
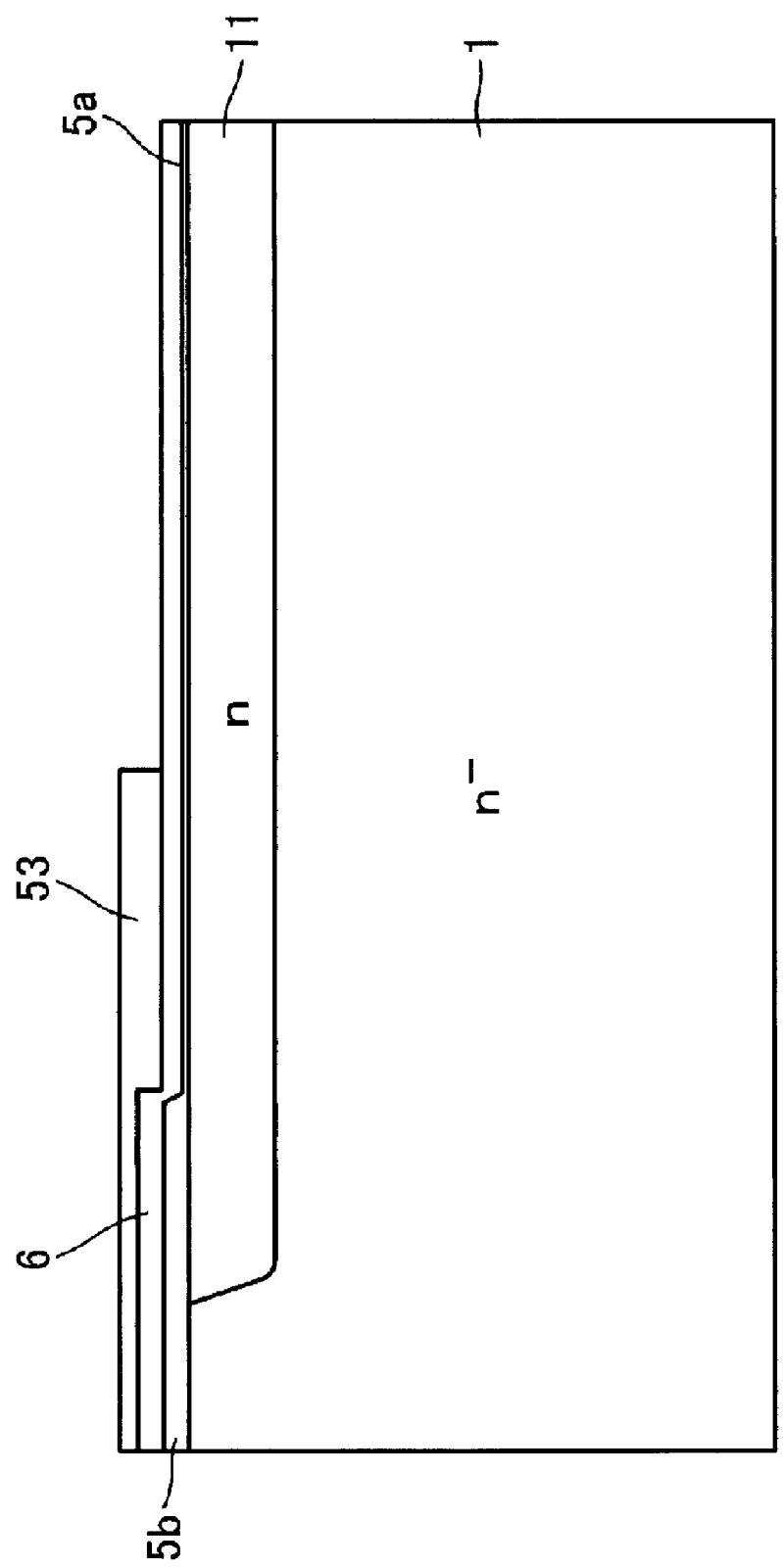
FIG. 10 is a sectional view showing the state in which the semiconductor device is being manufactured according to Embodiment 3.

Next, as shown in FIG. 10, a resist mask 53 which is opened to expose a part of the polysilicon layer is formed on the surface of the polysilicon layer serving as the gate electrode 6 by photolithography. Next, isotropic or anisotropic etching is carried out using the resist mask 53 as a mask to remove the portion of the polysilicon layer which is exposed in the opening portion of the resist mask 53. The polysilicon layer remaining on the gate insulating films 5a and 5b serves as the gate electrode 6. Next, the resist mask 53 is removed, and the n⁻ type wafer 1 is washed.

Figure 11:
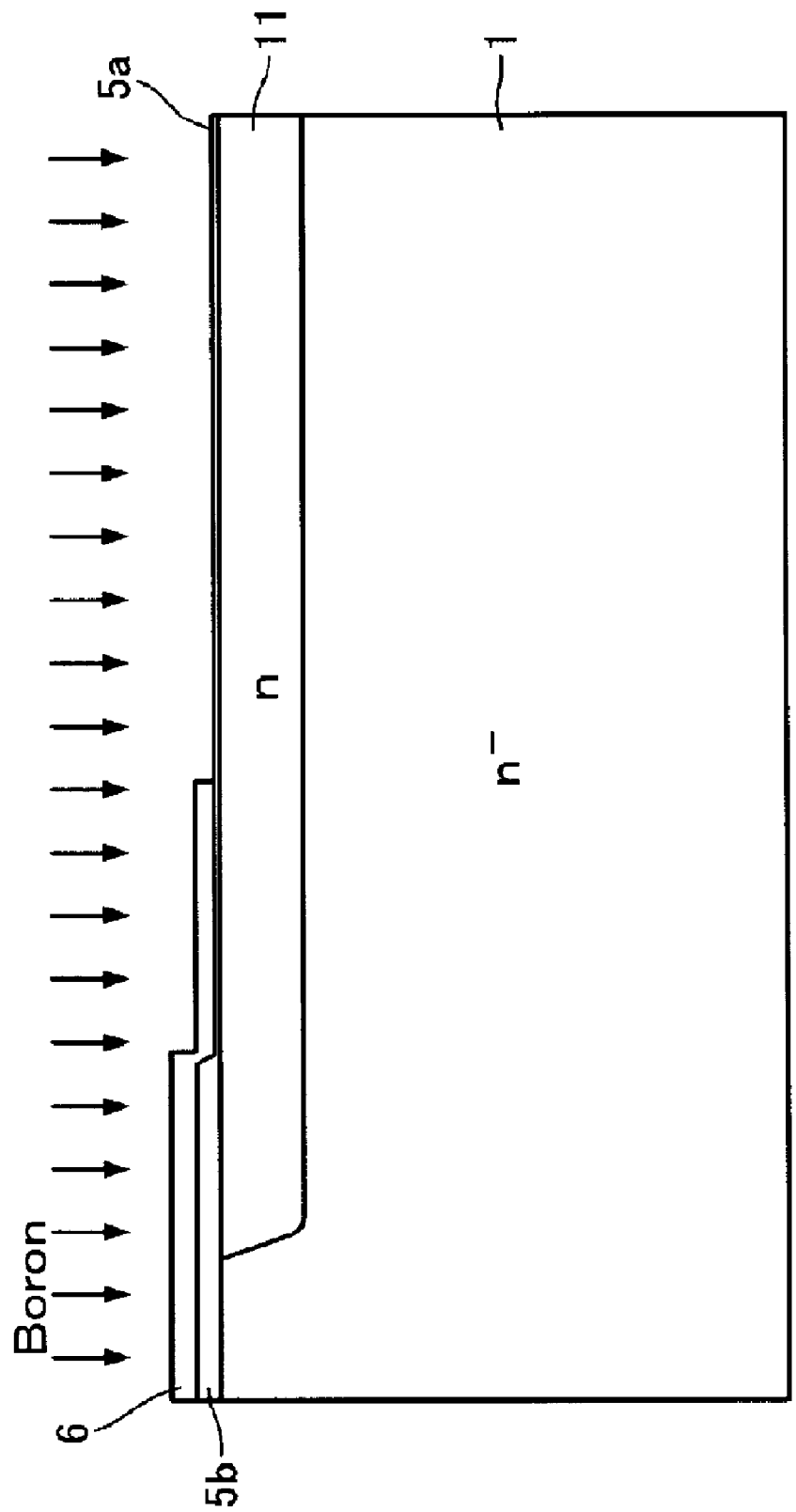
FIG. 11 is a sectional view showing the state in which the semiconductor device is being manufactured according to Embodiment 3.
Figure 12:
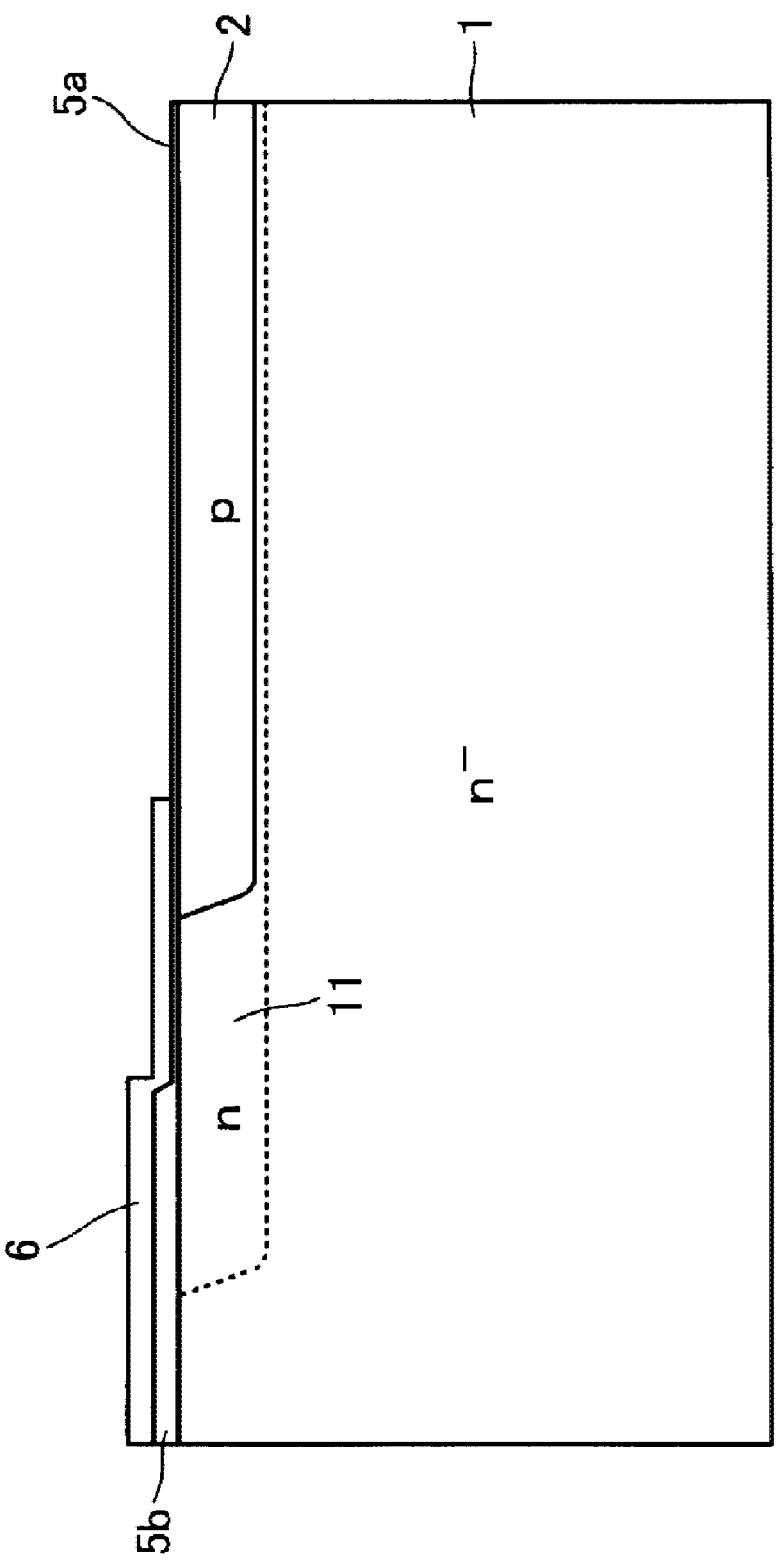
FIG. 12 is a sectional view showing the state in which the semiconductor device is being manufactured according to Embodiment 3.

Next, as shown in FIG. 11, p type impurities such as boron (B) are ion-injected into the front surface of the n⁻ type wafer in a self-aligning manner 1 using the gate electrode 6 as a mask. The ion injection is carried out perpendicularly to the surface of the n⁻ type wafer 1. In addition, the ion injection may be carried out, for example, at acceleration energy about 45 keV and dose in the order of $1.0\times10^{14}$ cm$^{-2}$. Next, as shown in FIG. 12, the p type impurities injected into the n⁻ type wafer 1 are thermally diffused by thermal diffusion treatment. The thermal diffusion treatment may be carried out, for example, at 1,150° C. for 2 hours in an inactive gas atmosphere. Thus, the p base region 2 self-aligned on an end portion of the gate electrode 6 is formed with a predetermined depth in the surface layer of the n region 11. Next, the n⁻ type wafer 1 is washed.

Figure 13:
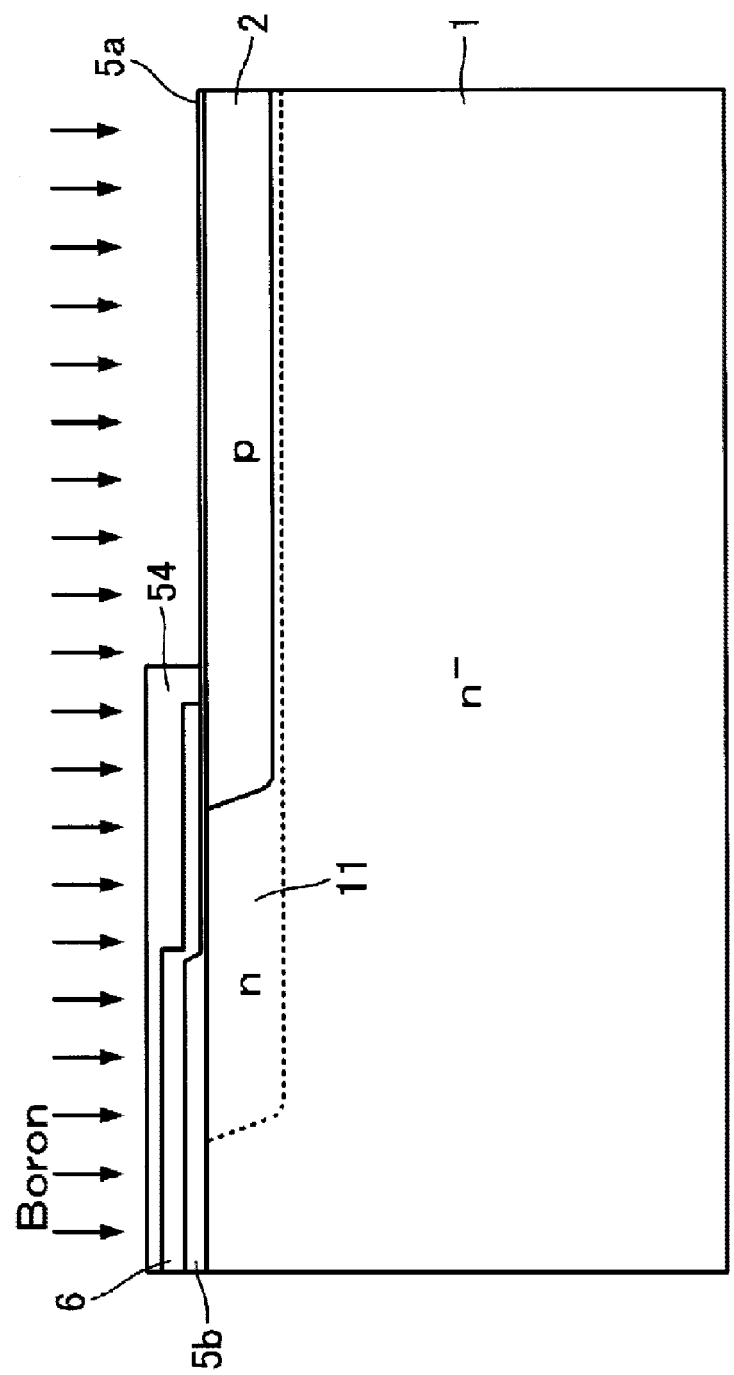
FIG. 13 is a sectional view showing the state in which the semiconductor device is being manufactured according to Embodiment 3.

Next, as shown in FIG. 13, a resist mask 54 which is opened to expose the region where the p⁺ contact region 4 will be formed is formed on the front surface side of the n⁻ type wafer 1 by photolithography. Next, p type impurities such as boron are ion-injected into the front surface of the n⁻ type wafer 1 from above the gate insulating film 5a using the resist mask 54 as a mask. The ion injection may be carried out, for example, at acceleration energy about 150 keV and dose in the order of $2.0\times10^{15}$ cm$^{-2}$. Then, the resist mask 54 is removed, and the n⁻ type wafer 1 is washed.

Figure 14:
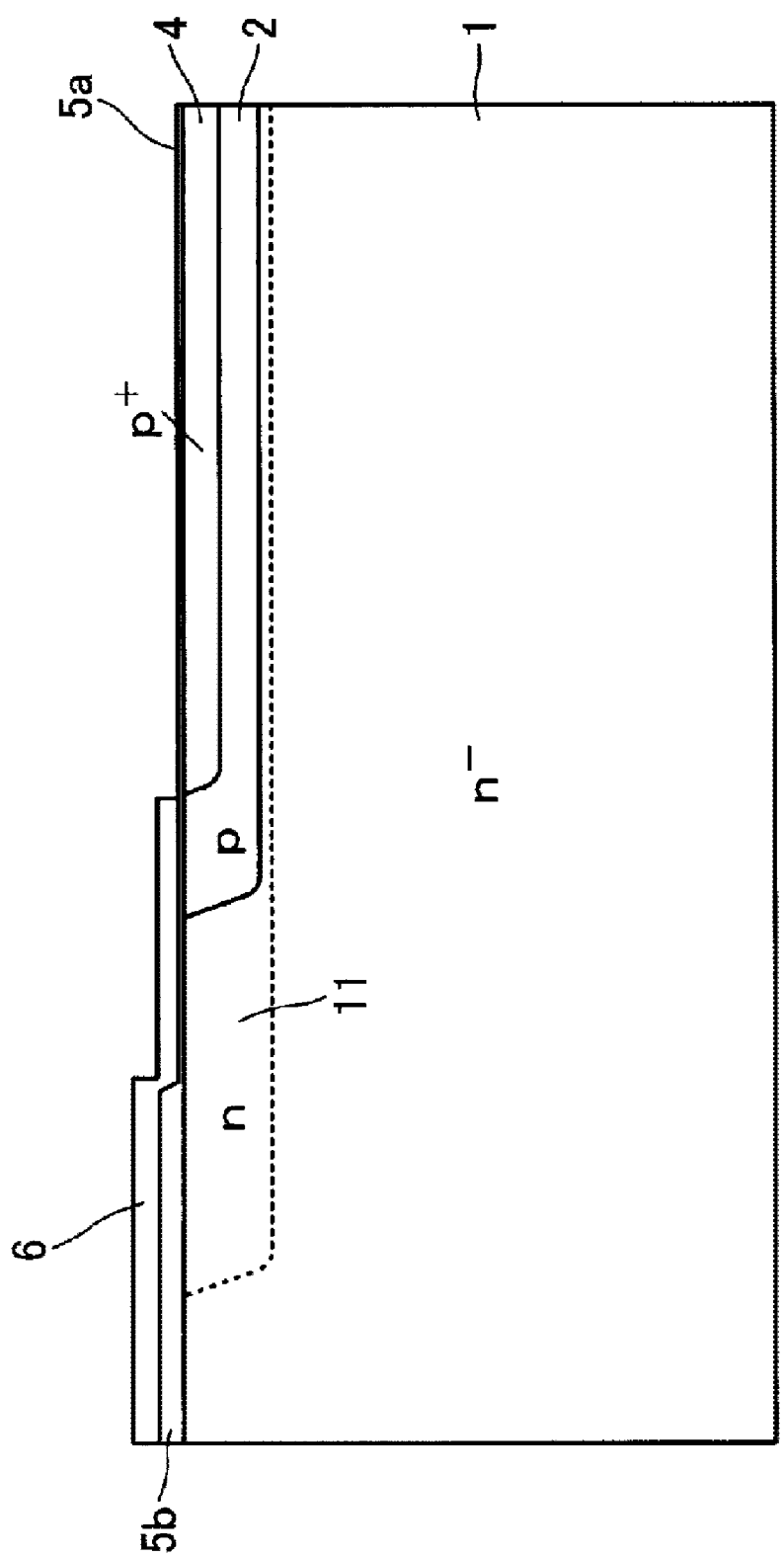
FIG. 14 is a sectional view showing the state in which the semiconductor device is being manufactured according to Embodiment 3.
Figure 15:
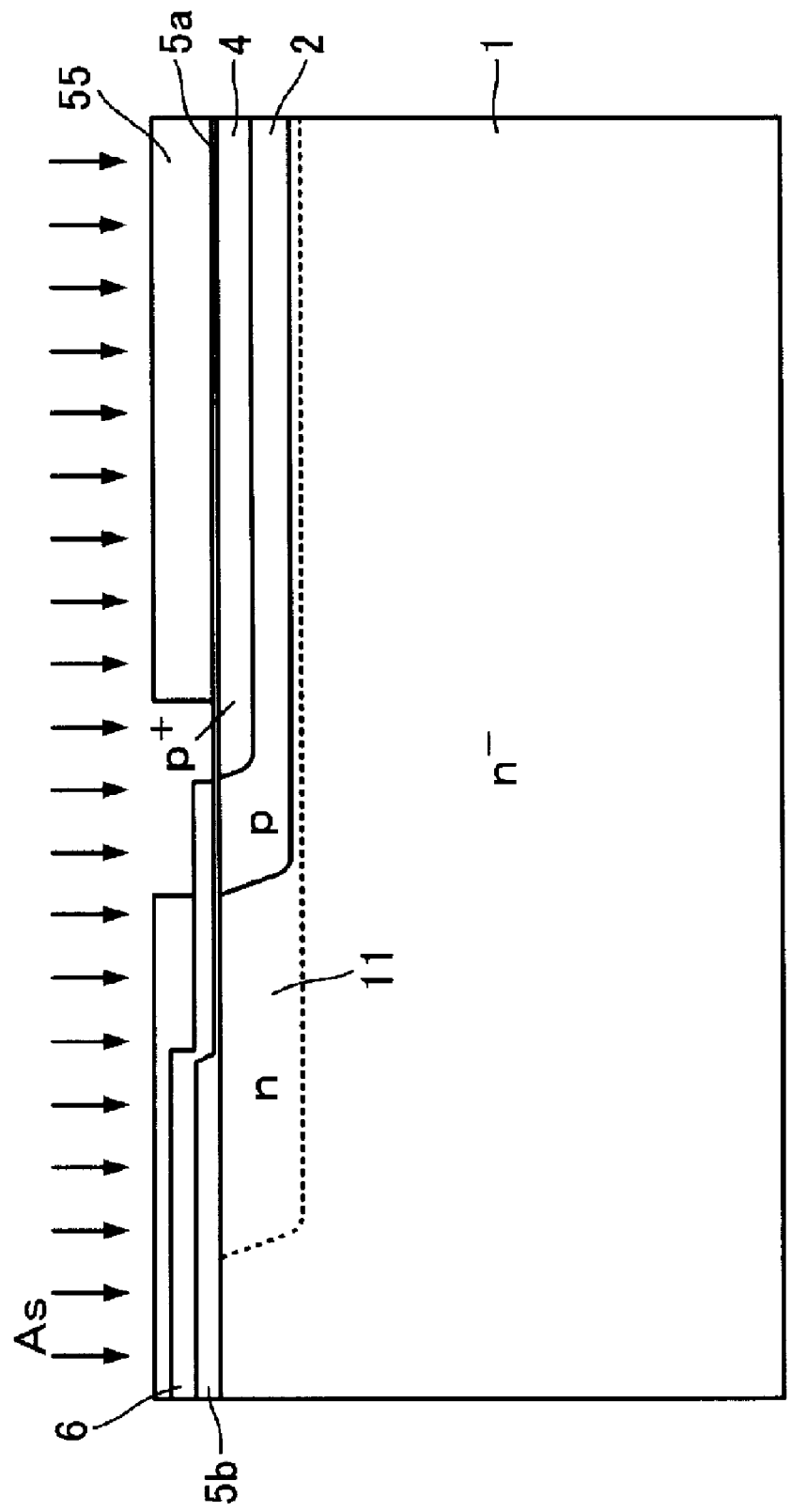
FIG. 15 is a sectional view showing the state in which the semiconductor device is being manufactured according to Embodiment 3.

Next, as shown in FIG. 14, the p type impurities injected into the n⁻ type wafer 1 are thermally diffused by thermal diffusion treatment. Thus, the p⁺ contact region 4 is formed with a predetermined diffusion depth in the surface layer of the p base region 2. Next, as shown in FIG. 15, a resist mask 55 which is opened to expose the region where the n⁺ emitter region 3 will be formed is formed on the front surface side of the n⁻ type wafer 1 by photolithography. Next, n type impurities such as arsenic (As) are ion-injected into the front surface of the n⁻ type wafer 1 from above the gate insulating film 5a using the resist mask 55 as a mask. The ion injection may be carried out, for example, at acceleration energy about 120 keV and dose in the order of $1.0\times10^{15}$ cm$^{-2}$. Then, the resist mask 55 is removed, and the n⁻ type wafer 1 is washed.

Figure 16:
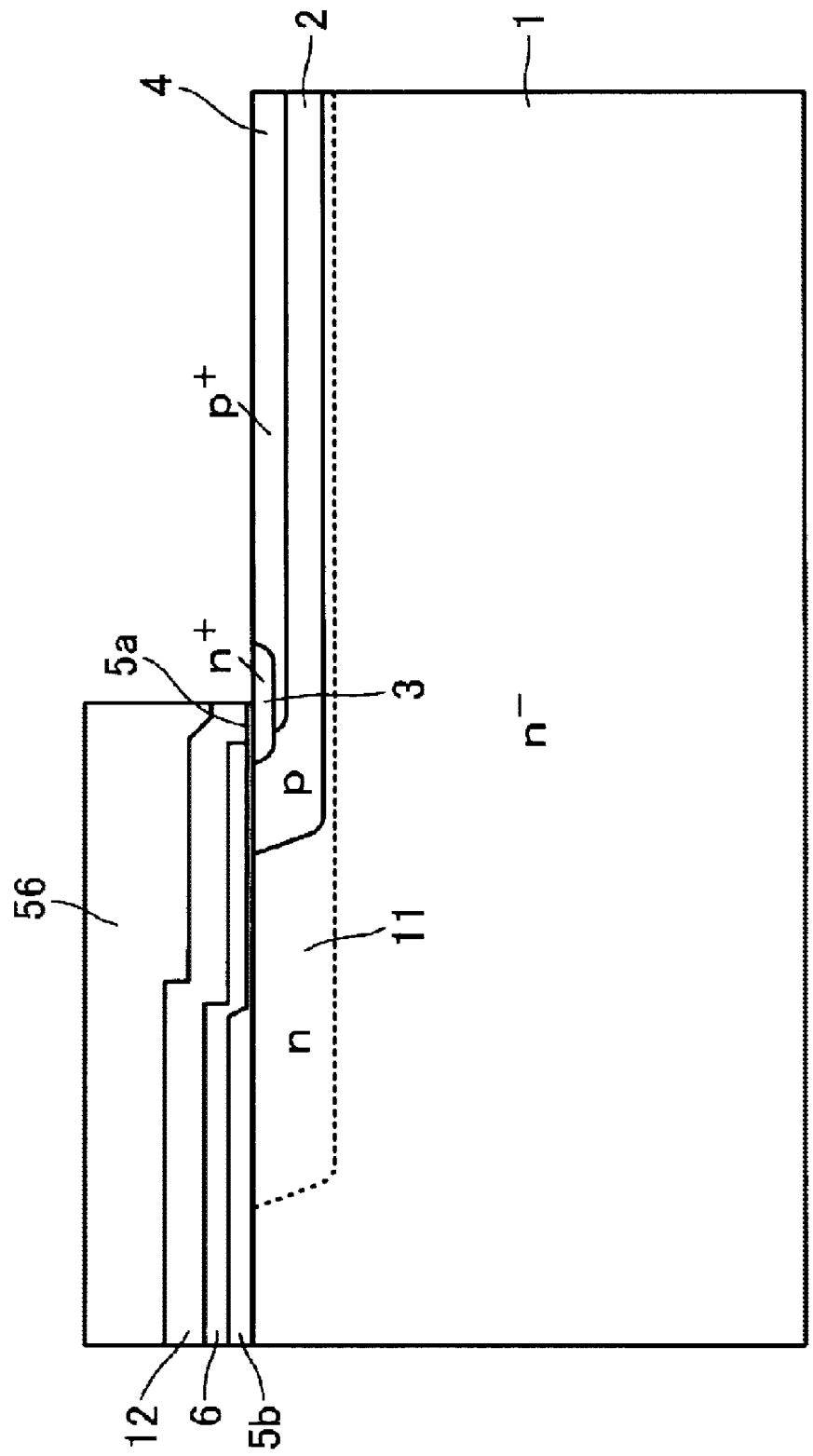
FIG. 16 is a sectional view showing the state in which the semiconductor device is being manufactured according to Embodiment 3.

Next, as shown in FIG. 16, the p type impurities injected into the n⁻ type wafer 1 are thermally diffused by thermal diffusion treatment. Thus, the n⁺ emitter region 3 is formed with a predetermined diffusion depth in the surface layers of the p base region 2 and the p⁺ contact region 4. Next, a composite film 12 consisting of an HTO (High Temperature Oxide) film and an interlayer insulating film is deposited on the front surface side of the n⁻ type wafer 1. The thickness of the HTO film may be, for example, 200 μm. The thickness of the interlayer insulating film may be, for example, 1 μm. The composite film 12 consisting of the HTO film and the interlayer insulating film will be referred to as "interlayer insulating film 12" simply. Next, thermal treatment is carried out on the interlayer insulating film 12 under an inactive gas atmosphere.

Next, a resist mask 56 which is opened to expose a contact portion with the emitter electrode 7 is formed on the front surface side of the n⁻ type wafer 1 by photolithography. Next, anisotropic etching or a combination of isotropic etching and anisotropic etching is carried out using the resist mask 56 as a mask so as to remove the interlayer insulating film 12 and the gate insulating film 5a exposed in the opening portion of the resist mask 56. Thus, the front surface of the n⁻ type wafer 1, that is, the n⁺ emitter region 3 and the p⁺ contact region 4 are exposed. Then, the resist mask 56 is removed, and the n⁻ type wafer 1 is washed.

Figure 17:
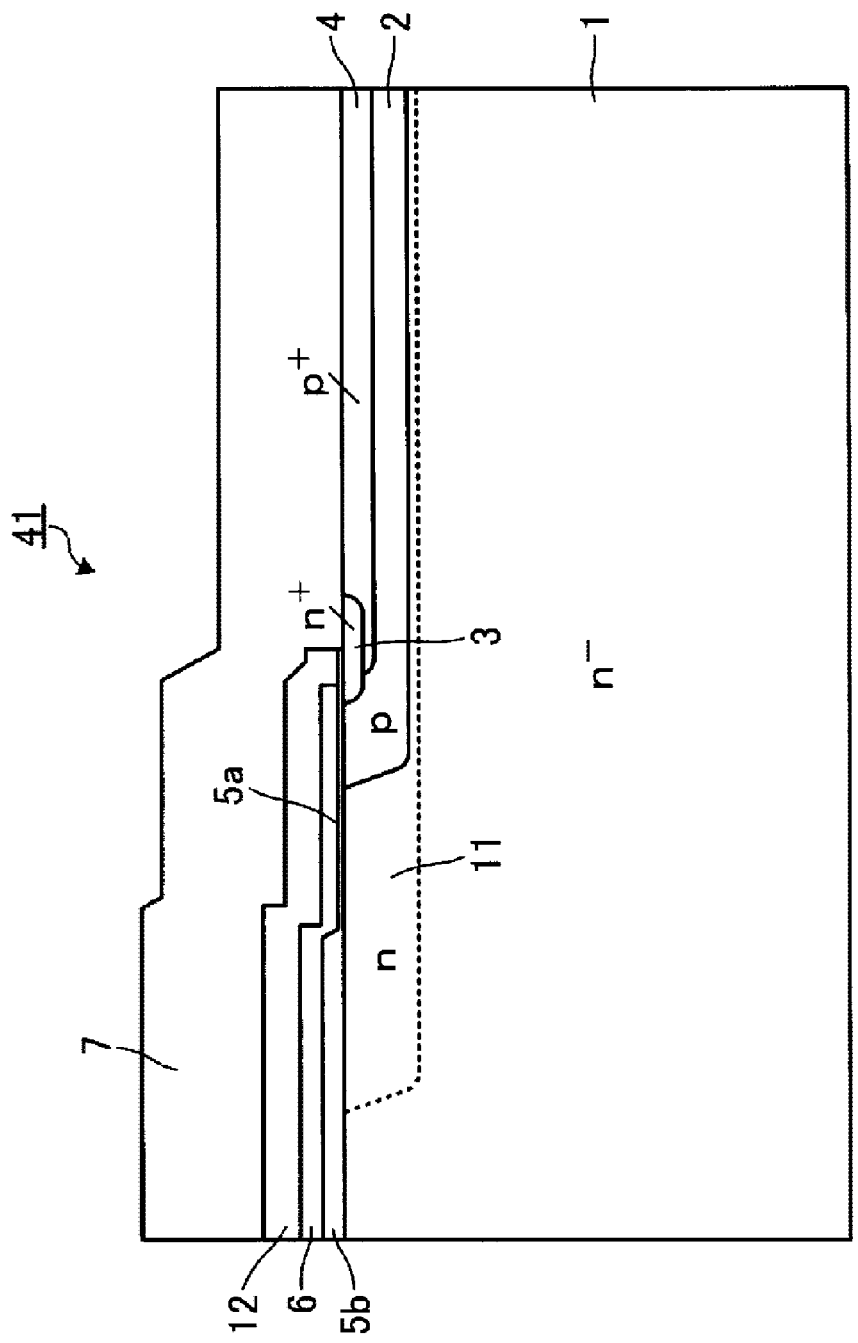
FIG. 17 is a sectional view showing the state in which the semiconductor device is being manufactured according to Embodiment 3.

Next, as shown in FIG. 17, an aluminum (Al) film serving as the emitter electrode 7 is deposited on the whole front surface side of the n⁻ type wafer 1 by sputtering. Next, a resist mask (not shown) is formed on the front surface of the n⁻ type wafer 1 by photolithography. Then, wet etching or dry etching is carried out using the resist mask as a mask to pattern the emitter electrode 7 with a desired pattern (not shown). Then, the resist mask used for patterning the emitter electrode 7 is removed, and the n⁻ type wafer 1 is washed.

Next, a passivation film (not shown) such as a silicon nitride (SiN) film or a polyimide film is deposited on the front surface side of the n⁻ type wafer 1. Next, a resist mask (not shown) is formed on the front surface side of the n⁻ type wafer 1 by photolithography. Next, etching is carried out using the resist mask as a mask to pattern the passivation film deposited on the emitter electrode 7 and expose the emitter electrode 7 partially. Thus, a pad (PAD) region for connecting the emitter electrode 7, for example, with an external device is formed, and the front surface element structure 41 is completed. Then, the resist mask used for patterning the passivation film is removed, and the n⁻ type wafer 1 is washed.

Figure 18:
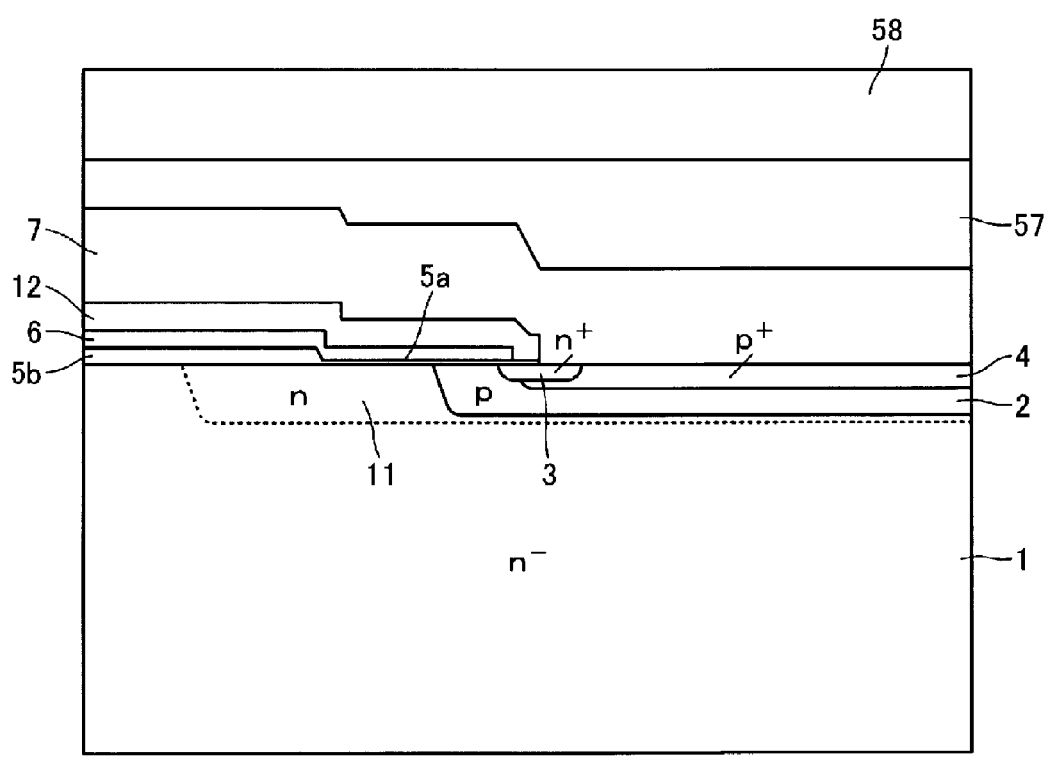
FIG. 18 is a sectional view showing the state in which the semiconductor device is being manufactured according to Embodiment 3.

Next, as shown in FIG. 18, a resist (hereinafter referred to as "protective resist") 57 for protecting the front surface element structure 41, the terminal structure, etc. is applied and hardened on the front surface side of the n⁻ type wafer 1. Next, a tape (hereinafter referred to as "BG tape") 58 for protecting the n⁻ type wafer 1 during back grinding (BG) is pasted onto the protective resist 57. Next, the back surface of the n⁻ type wafer 1 is ground to thin the n⁻ type wafer 1 down to a desired thickness. Then, the BG tape 58 is removed, and the n⁻ type wafer 1 is washed. Next, the whole back surface of the n⁻ type wafer 1 is removed uniformly by etching so as to further thin the n⁻ type wafer 1 down to a thickness not thinner than 5 μm and not thicker than 20 μm in order to remove injuries appearing in the back surface of the n⁻ type wafer 1 due to the grinding and to relax the stress on the n⁻ type wafer 1. Thickness of the final n⁻ type wafer 1 may be, for example, about 250 μm to about 290 μm enough to form an NPT structure.

Figure 19:
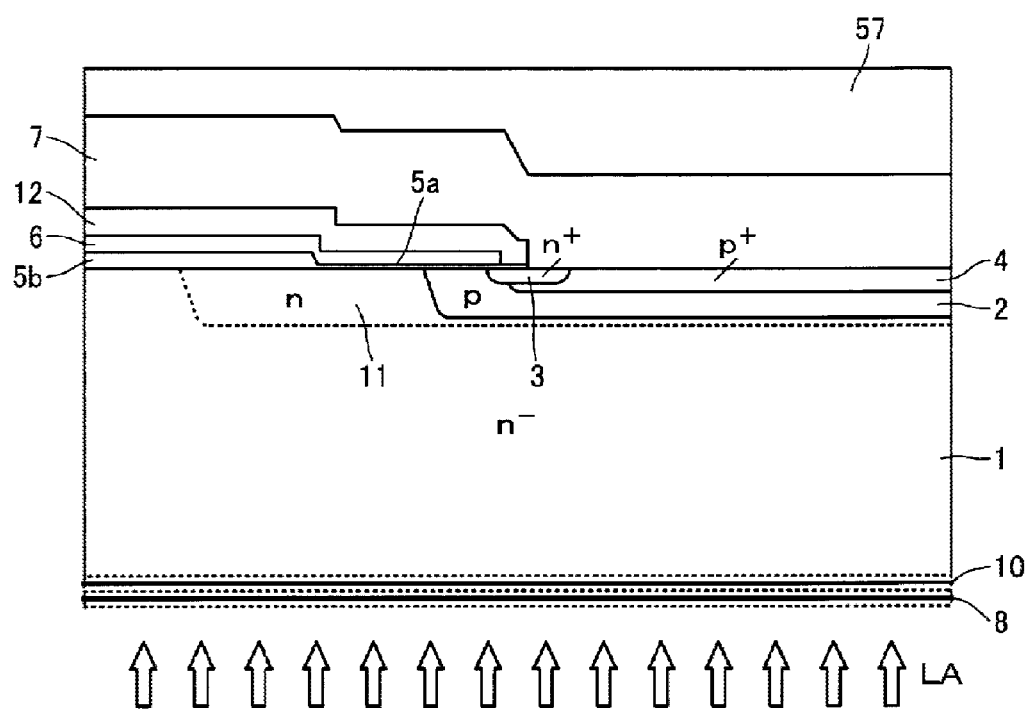
FIG. 19 is a sectional view showing the state in which the semiconductor device is being manufactured according to Embodiment 3.

Next, as shown in FIG. 19, ion injection with ions of p type impurities is performed on the whole back surface of the n⁻ type wafer 1, for example, twice at different acceleration energies. Specifically, p type impurities such as boron are ion-injected into the whole back surface of the n⁻ type wafer 1 at the first acceleration energy. Then, p type impurities such as boron are ion-injected into the whole back surface of the n⁻ type wafer 1 ion-injected with the p type impurities, again, at the second acceleration energy which is lower than the first acceleration energy. The first and second ion injections are, for example, conditioned as follows.

In the first ion injection, for example, the first acceleration energy may be made, for example, not lower than 100 keV and not higher than 300 keV, and the dose may be made not lower than $1.0 \times 10^{13}$ cm⁻² and not higher than $3.0 \times 10^{14}$ cm⁻². In the second ion injection, the second acceleration energy may be made, for example, not lower than 30 keV and not higher than 60 keV, and the dose may be made not lower than $1.0 \times 10^{13}$ cm⁻² and not higher than $3.0 \times 10^{14}$ cm⁻². The first ion injection and the second ion injection may be carried out at the same dose or different doses or may be replaced by each other in sequence.

Next, the p type impurities introduced into the back surface of the n⁻ type wafer 1 are electrically activated by thermal treatment. Thus, the p collector region 8 is formed in the surface layer of the back surface of the n⁻ type wafer 1 while the low life time region 10 is formed in the interface between the n⁻ drift region (n⁻ type wafer 1) and the p collector region 8. That is, in the surface layer of the back surface of the n⁻ type wafer 1 into which the p type impurities have been injected, thermal treatment is carried out to electrically activate the portion up to a predetermined depth from the back surface (the portion which will serve as the p collector region 8 on the back surface side of the n⁻ type wafer 1) entirely but not to activate the portion deeper than the predetermined depth from the back surface (the region which will serve as the low life time region 10) partially.

Specifically, in the thermal treatment, for example, the back surface of the n⁻ type wafer 1 is irradiated with a laser LA so as to electrically activate the p type impurities introduced into the back surface of the n⁻ type wafer 1. Thus, the low life time region 10 in which the p type impurities have been activated partially corresponding to the concentration distribution of the p type impurities with lower activation ratio than those in the p collector region 8 is formed. A laser with irradiation energy density not lower than $1.0 \times 10^{-3}$ J/cm² and not higher than $2.0 \times 10^{-3}$ J/cm² and photon energy higher than 1.1 eV may be used as the laser LA, or an YAG laser whose wavelength is 532 nm may be used.

Preferably, a laser having lower irradiation energy density than the critical irradiation energy density with which silicon can be fused may be used as the laser LA. Alternatively, for example, annealing the n⁻ type wafer 1 at 380° C. for 1 hour may be carried out in an annealing furnace in place of the irradiation with the laser LA. When the laser LA is used, the activation ratio of the p collector region 8 can be made higher than when the annealing furnace is used. It is therefore possible to reduce a leak current from the pn junction between the n⁻ drift region 1 and the p collector region 8.

Next, the protective resist 57 for protecting the front surface element structure 41 etc. on the front surface side of the n⁻ type wafer 1 is removed, and the n⁻ type wafer 1 is washed. Next, an electrode material serving as the collector electrode 9 is deposited on the surface of the p collector region 8. Next, for example, thermal treatment at a temperature not lower than 280° C. and not higher than 330° C. is carried out on the electrode material under an inactive gas atmosphere. The thermal treatment for forming the collector electrode 9 is lower in thermal treatment temperature than the thermal treatment for activating the p collector region 8. Thus, there is no fear that the activation ratio of the low life time region 10 may be changed. As a result of the thermal treatment, the collector electrode 9 is formed on the back surface of the n⁻ type wafer 1, and the RB-IGBT shown in FIG. 2 is completed.

A step of irradiating the back surface of the n⁻ type wafer 1, for example, with an electron beam (EB) or light ions such as protons (H⁺) and a step of annealing (thermal treatment) after that may be added in the aforementioned manufacturing process in order to adjust the carrier life time of the n⁻ drift region 1. The light ion irradiation to adjust the carrier life time of the n⁻ drift region is, for example, carried out from the front or back surface of the n⁻ type wafer 1 at acceleration energy from about 4 MeV to about 6 MeV and dose from about 10 kGry to about 30 kGry. On the other hand, the annealing after the light ion irradiation is carried out at annealing temperature from 320° C. to 340° C. for annealing time from 50 minutes to 70 minutes. Thus, the carrier life time can be made comparatively longer than that in a typical NPT structure device. The steps for adjusting the carrier life time may be carried out after the front surface element structure 41 of the RB-IGNT is formed (see FIG. 17) and before the ion injection step for forming the p collector region 8 and the lowlife time region 10 is carried out on the back surface side of the n⁻ type wafer 1.

In addition, when p⁺ isolation regions are formed at a depth from the front surface of the n⁻ type wafer 1 not smaller than the final thickness of the n⁻ type wafer 1 in the aforementioned method for manufacturing the semiconductor device according Embodiment 3, the semiconductor device according to Embodiment 1 can be manufactured. In this case, the grooves 22 are not formed in the back surface of the n⁻ type wafer 1. The other steps in the case where the semiconductor device according to Embodiment 1 is manufactured by the method for manufacturing the semiconductor device according to Embodiment 3 are the same as those in the case where the semiconductor device according to Embodiment 2 is manufactured by the method for manufacturing the semiconductor device according to Embodiment 3.

As described above, effects similar to those in Embodiment 1 or 2 can be obtained according to Embodiment 3.

(About On-State Voltage Von Characteristic)

Figure 20:
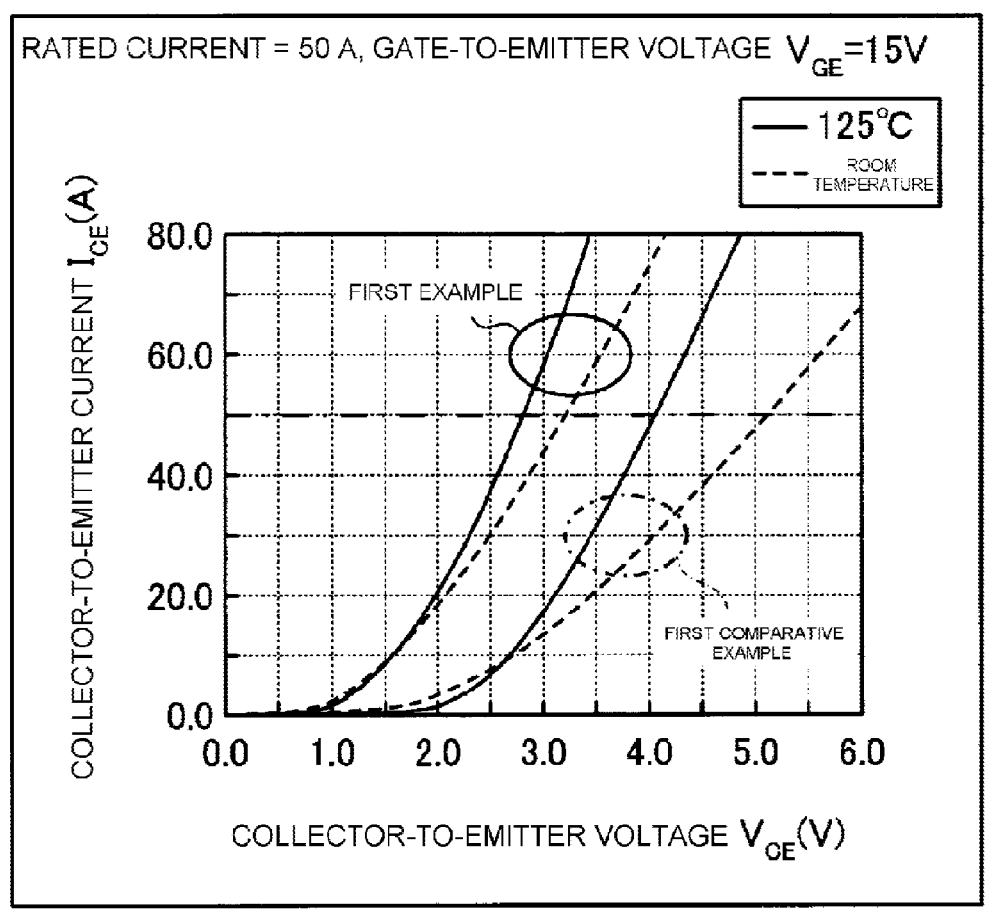
FIG. 20 is a characteristic graph showing the on-state voltage characteristic of a semiconductor device according to a first example.
Figure 21:
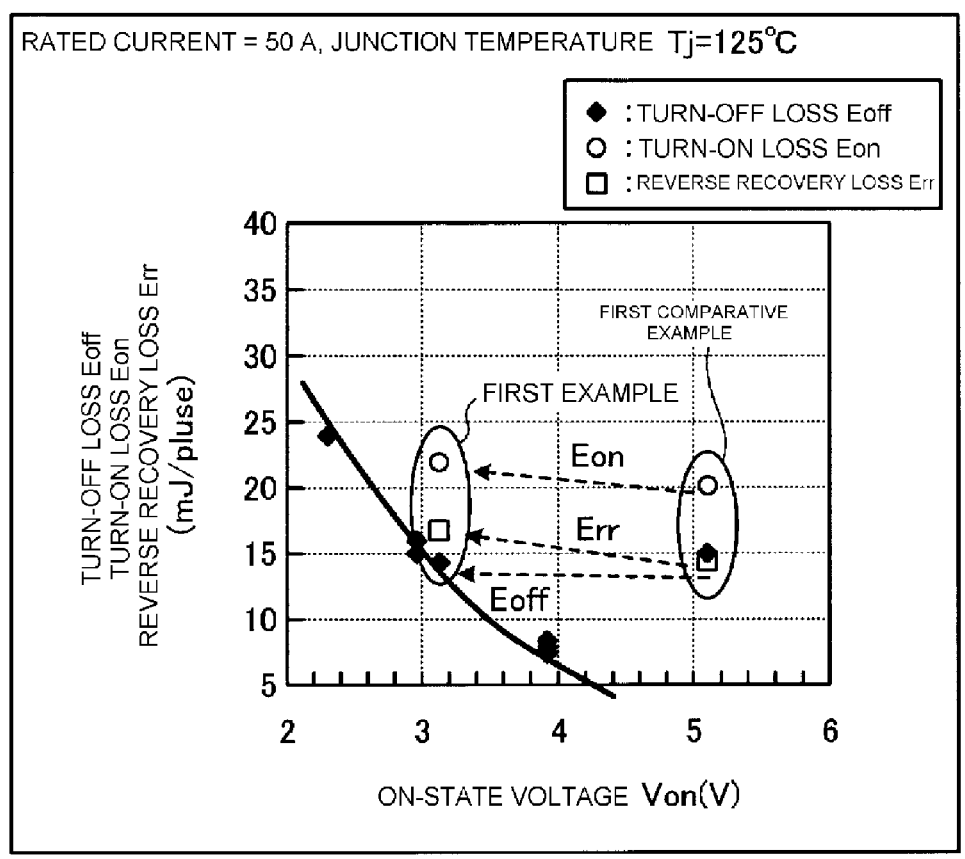
FIG. 21 is a characteristic graph showing the relationship between the on-state voltage and the switching loss in the semiconductor device according to the first example.

Next, the current-to-voltage characteristic (I-V characteristic) of the semiconductor device according to a first example was verified. FIG. 20 is a characteristic graph showing the on-state voltage characteristic of the semiconductor device according to the first example. FIG. 21 is a characteristic graph showing the relationship between the on-state voltage and the switching loss in the semiconductor device according to the first example. FIG. 22 is a table showing measured values in each characteristic of FIGS. 20 and 21. First, the semiconductor device according to Embodiment 2 was manufactured in the method for manufacturing the semiconductor device according to Embodiment 3 (as the first example). That is, the first example is an NPT type RB-IGBT in which the thickness on the chip outer circumferential portion side is smaller than the thickness on the active region side. The withstand voltage was set at 1,700 V. The thickness of a silicon substrate serving as the n⁻ drift region 1 was set at about 270 μm, which was larger than the thickness of a silicon substrate constituting a first comparative example which will be described later, by about ⅓ of the thickness of the silicon substrate constituting the first comparative example.

In addition, in the first example, after the front surface element structure 41 was formed, irradiation with an electron beam and annealing after the irradiation were carried out to adjust the carrier life time. On this occasion, the acceleration energy of the electron beam was set at 4.6 MeV, and the dose of the electron beam was set from 10 kGry to 30 kGry. In addition, the annealing temperature was set from 320° C. to 340° C. and the annealing time was set at 60 minutes. The carrier life time in a typical NPT structure device is adjusted with an electron beam at acceleration energy about 4.6 MeV and dose of the electron beam from about 60 kGry to about 120 kGry, and at annealing temperature about 340° C. Therefore, the carrier time life is comparatively longer in the first example than in the typical NPT structure device. For comparison, an IGBT with a withstand voltage of 3.3 kV and an FWD with a withstand voltage of 3.3 kV were prepared, and a first comparative example in which the IGBT and the FWD were connected in series was manufactured.

In the first example and the first comparative example, the on-state voltage Von and the switching loss (turn-off loss Eoff, turn-on loss Eon and reverse recovery loss Err) were measured on one and the same switching conditions. The switching conditions on this occasion were a bus voltage Vbus of 850 V, a rated current of 50 A, and a gate-to-emitter voltage $V_{GE}$ of 15 V. The rated current is an upper limit of a current which can secure normal operation. The on-state voltage Von was measured under a temperature environment of room temperature (about 25° C.) and a temperature environment of 125° C. In FIGS. 20 and 22, the on-state voltage Von in the first comparative example is a total sum of the on-state voltage (=2.86 V) of the IGBT and the forward voltage $V_F$ (=2.28 V) of the FWD.

From the results shown in FIGS. 20 and 21, it was proved that the turn-off loss Eoff in the first example was substantially as low as that in the first comparative example while the thickness of the silicon substrate was larger than that in the first comparative example because the first example used an NPT structure. This was because the low life time region 10 was formed to suppress injection of holes (positive holes) from the p collector region 8 to the n⁻ drift region 1 in the turn-on state, and, in addition, the carrier life time of the n⁻ drift region 1 was made as long as possible by design so as to increase the electron transport coefficient in the n⁻ drift region 1. In addition, in the first example, due to the silicon substrate which was thicker than that in the first comparative example, the current capability (on-state voltage Von) was inferior to that in the first comparative example but it was, however, proved that the turn-on loss Eon was suppressed to about 10% increase (=20.1 [mJ/pulse]×110%) as compared with that in the first comparative example.

On the other hand, according to the first example, in addition to the carrier life time which was comparatively long, the silicon substrate was larger than that in the first comparative example. Therefore, carriers accumulated in the silicon substrate were more than those in the FWD of the first comparative example. Accordingly, when a very small current (for example, about 10% of the rated current) flows in the first example, there is a fear that the reverse recovery loss Err may increase in addition to the occurrence of magnetic noise caused by an excessive reverse recovery current and a jump voltage generated due to transition from a steady on-state to a reverse recovery process in a diode mode in the first example.

(About Reverse Recovery Characteristic)

Therefore, a reverse recovery test with a very small current flowing at a room temperature was carried out on the first example. Specifically, two devices of the first example each with a rated current of 50 A were connected in parallel so as to form a bidirectional switch 130 with a rated current of 100 A, and an A-NPC circuit configured in such a manner that the intermediate potential (output point potential in the connection point 105) of the main switch 100 was clamped by the bidirectional switch 130 was manufactured (hereinafter referred to as "second example", see FIG. 33).

For comparison, two devices of the first comparative example were connected in parallel so as to form a bidirectional switch 110 with a rated current of 100 A, and an A-NPC circuit configured in such a manner that the intermediate potential of the main switch 100 was clamped by the bidirectional switch 110 was manufactured (hereinafter referred to as "second comparative example", see FIG. 32). That is, the bidirectional switch 110 of the second comparative example was constituted by the combination of two IGBTs and two FWDs.

Then, in the second example and the second comparative example, the switching loss was measured while variously changing the turn-on di/dt of the IGBTs 101 and 102 (turn-on di/dt of the main IGBTs) constituting the main switch 100 of the A-NPC circuit. The very small current flowing into the A-NPC circuit was set as 10% of the rated current of 100 A. Bus voltage Vbus was set at 850 V (=½×DC power $V_{DC}$), and parasitic inductance Ls was set at 0.3 pH. FIGS. 23 to 29 show a jump voltage $V_{AK}$, a reverse recovery current peak Irp and a reverse recovery loss Err measured for each turn-on di/dt of the main IGBTs.

Figure 23:
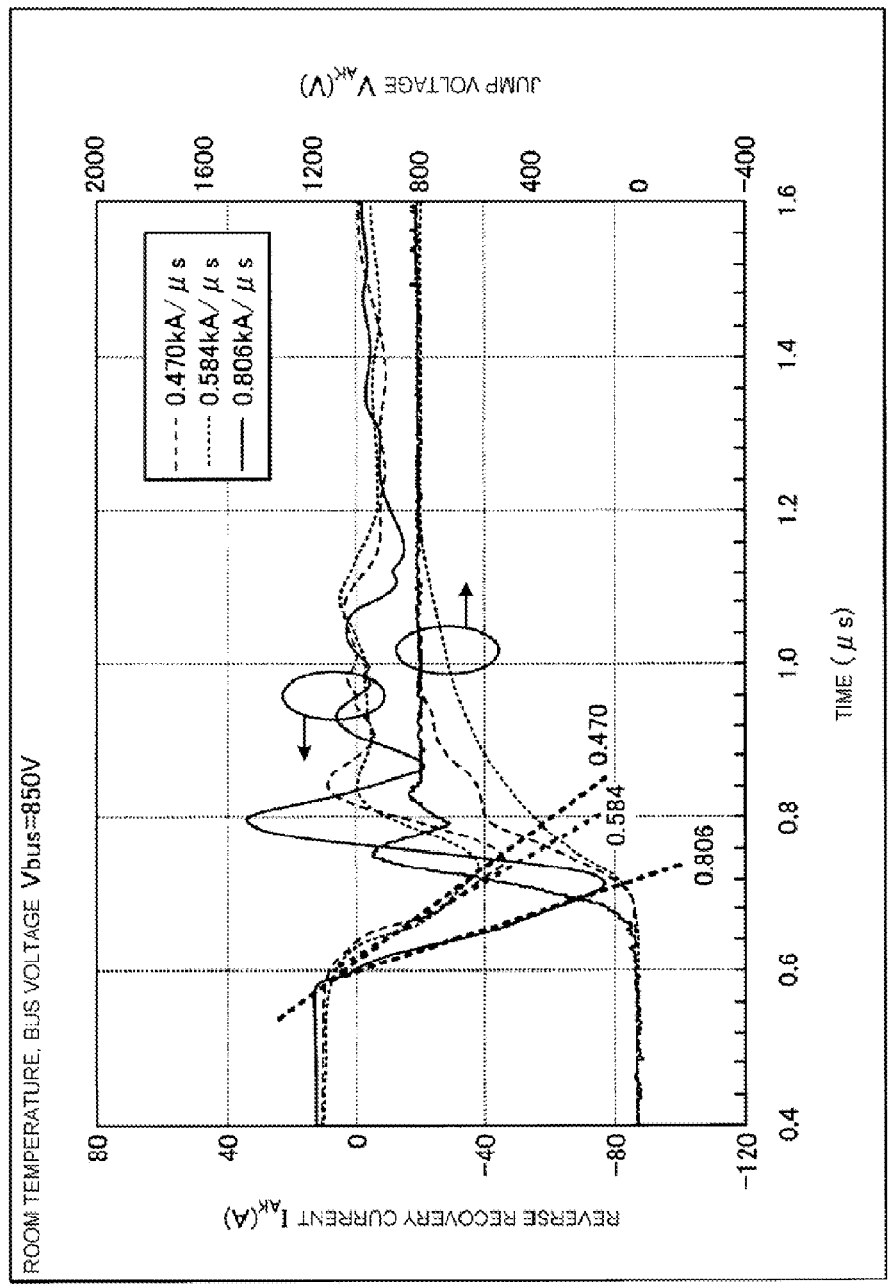
FIG. 23 is a characteristic graph showing the reverse recovery waveform of a semiconductor device according to a second example.
Figure 24:
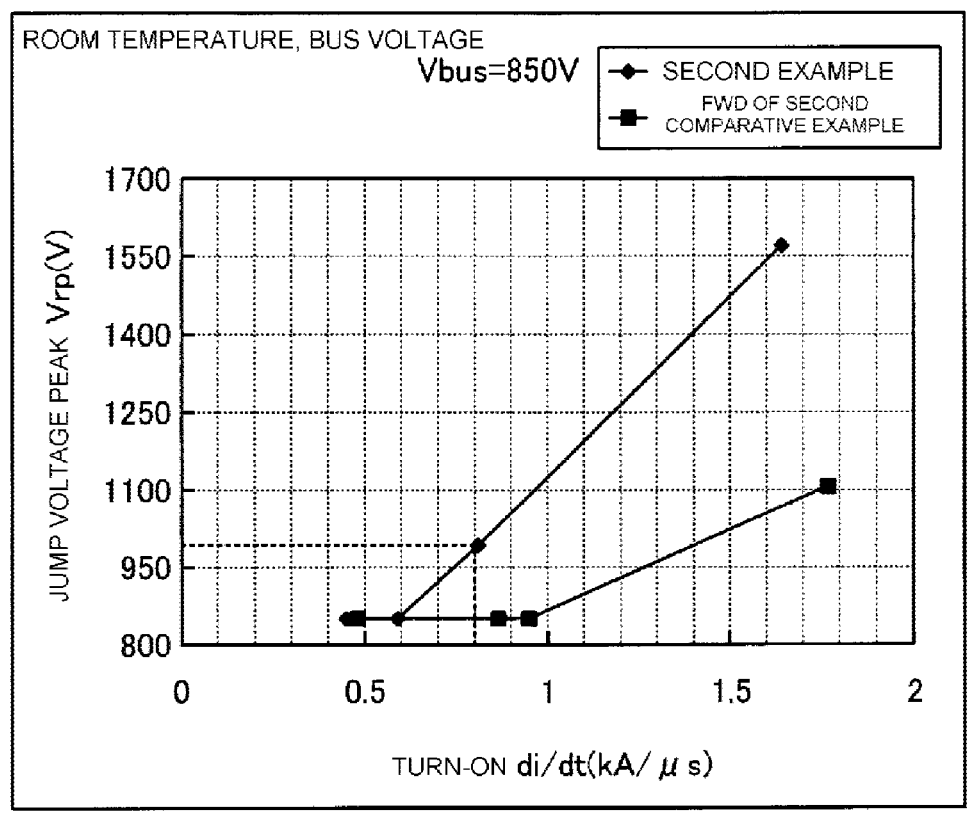
FIG. 24 is a characteristic graph showing the relationship between the turn-on di/dt and the jump voltage peak in the semiconductor device according to the second example (room temperature)
Figure 25:
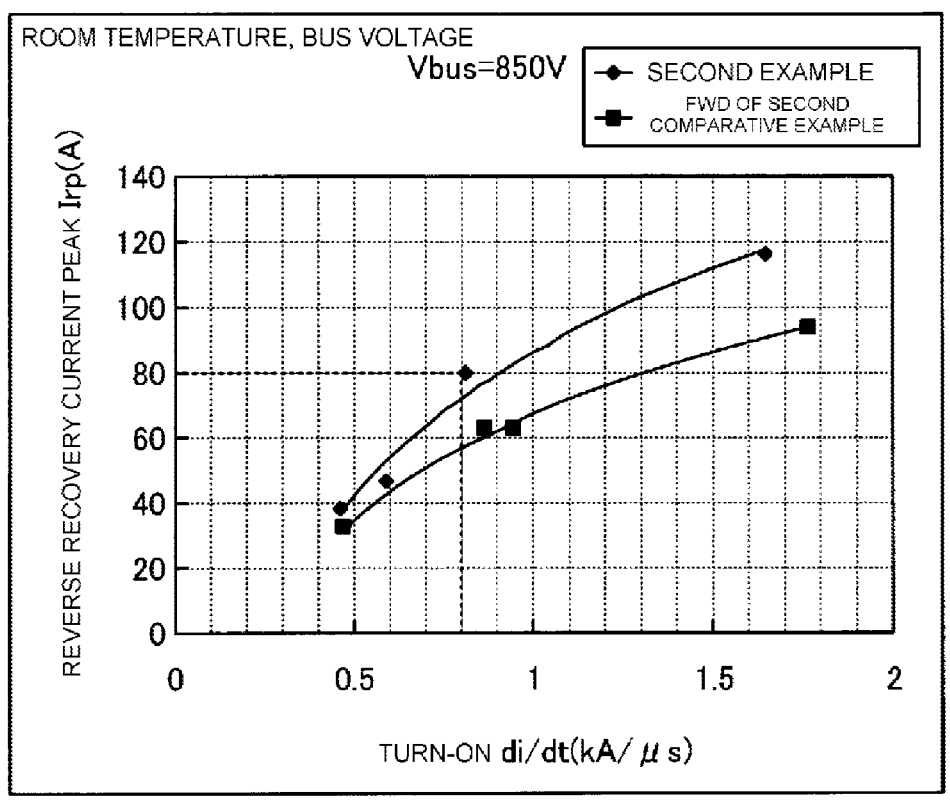
FIG. 25 is a characteristic graph showing the relationship between the turn-on di/dt and the reverse recovery current peak in the semiconductor device according to the second example (room temperature)
Figure 26:
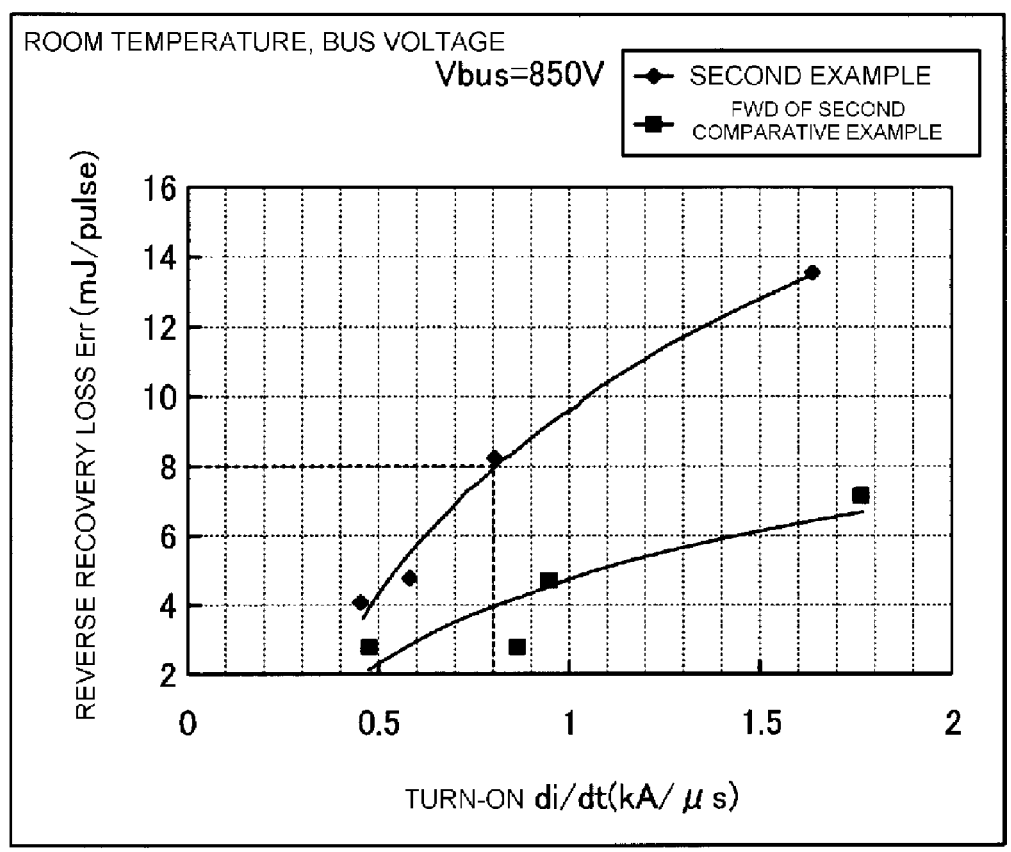
FIG. 26 is a characteristic graph showing the relationship between the turn-on di/dt and the reverse recovery loss in the semiconductor device according to the second example (room temperature)
Figure 27:
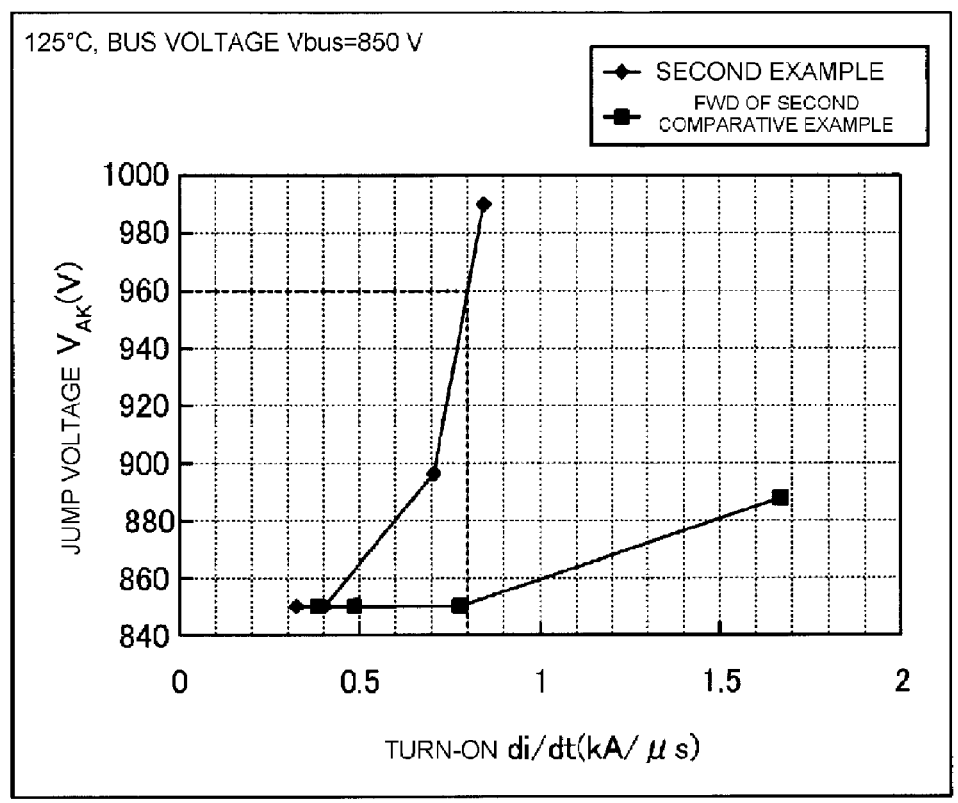
FIG. 27 is a characteristic graph showing the relationship between the turn-on di/dt and the jump voltage peak in the semiconductor device according to the second example (under a temperature environment of 125° C.)
Figure 28:
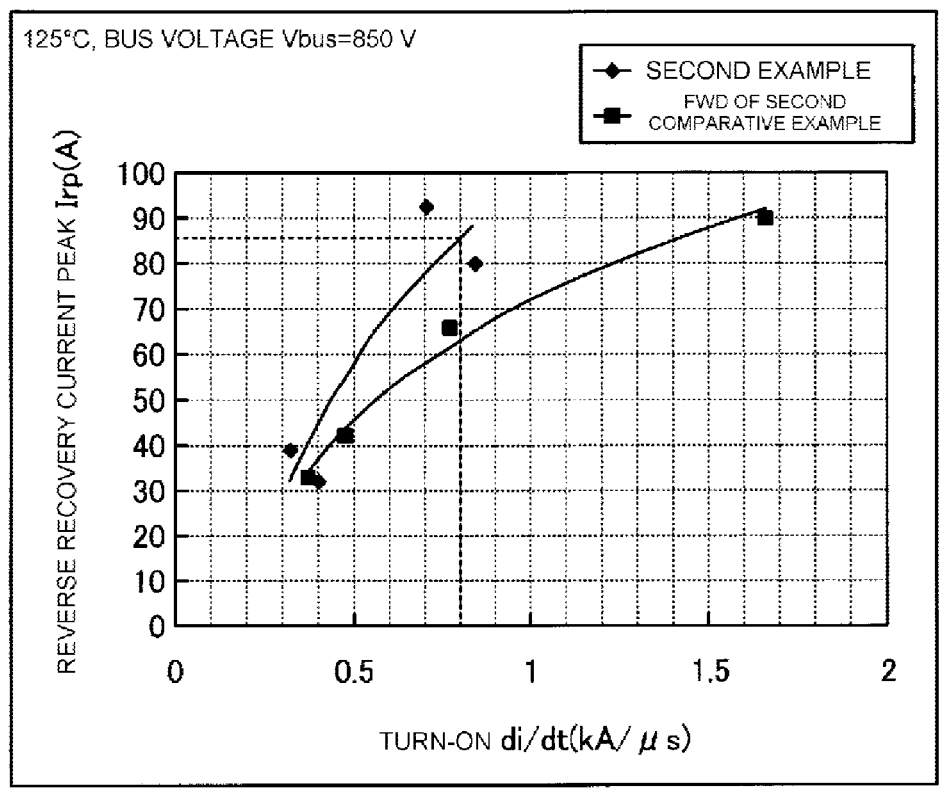
FIG. 28 is a characteristic graph showing the relationship between the turn-on di/dt and the reverse recovery current peak in the semiconductor device according to the second example (under a temperature environment of 125° C.)
Figure 29:
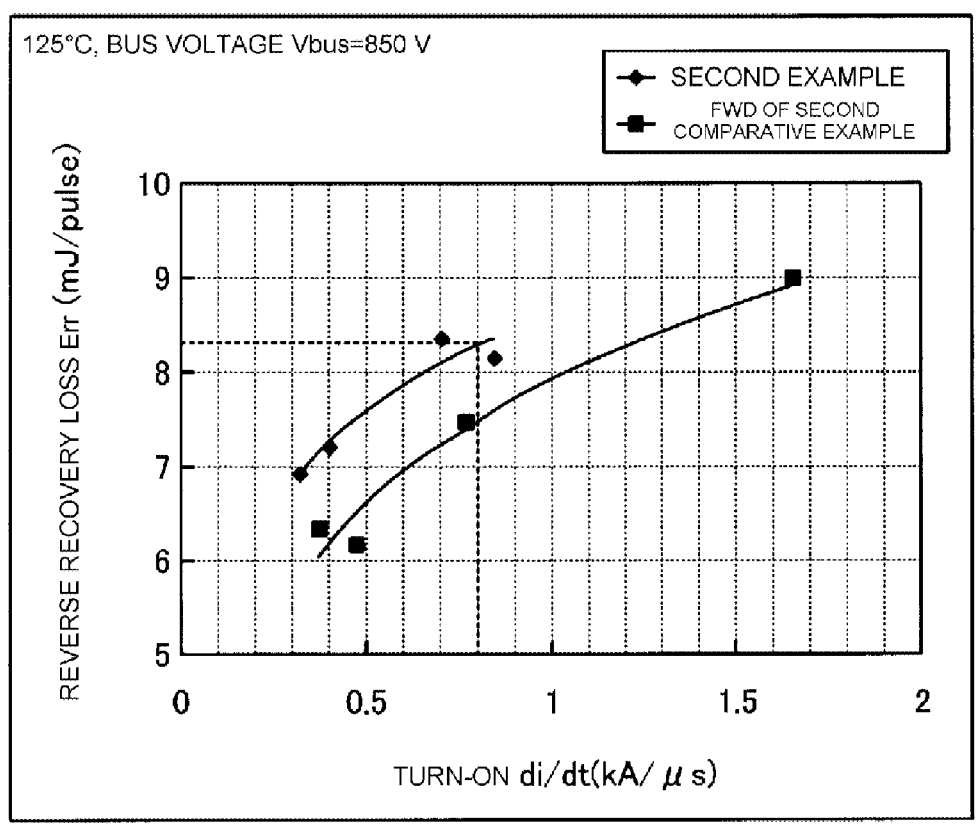
FIG. 29 is a characteristic graph showing the relationship between the turn-on di/dt and the reverse recovery loss in the semiconductor device according to the second example (under a temperature environment of 125° C.)

FIG. 23 is a characteristic graph showing the reverse recovery waveform of the semiconductor device according to the second example. FIGS. 24 and 27 are characteristic graphs showing the relationship between the turn-on di/dt and the jump voltage peak in the semiconductor device according to the second example. FIGS. 25 and 28 are characteristic graphs showing the relationship between the turn-on di/dt and the reverse recovery current peak in the semiconductor device according to the second example. FIGS. 26 and 29 are characteristic graphs showing the relationship between the turn-on di/dt and the reverse recovery loss in the semiconductor device according to the second example. FIG. 23 shows reverse recovery waveforms when the turn-on di/dt of the main IGBTs was 0.470 kA/μs, 0.584 kA/μs, and 0.806 kA/μs. FIGS. 24 to 26 show results of measurements at a room temperature, and FIGS. 27 to 29 show results of measurements at a temperature environment of 125° C.

From the results shown in FIGS. 23 and 24, it was proved that the turn-on di/dt of the main IGBTs had to be made smaller than 0.8 kA/μs in order to make the jump voltage peak Vrp (that is, jump voltage $V_{AK}$) at the room temperature not higher than 1,000 V. From the result shown in FIG. 27, it was proved that also under the temperature environment of 125° C., in the same manner as at the room temperature, the jump voltage peak Vrp could be made not higher than 1,000 V when the turn-on di/dt of the main IGBTs was made smaller than 0.8 kA/μs. The reason why the jump voltage peak Vrp was made not higher than 1,000 V was to prevent the jump voltage peak Vrp from exceeding the maximum allowable voltage which can be applied to each bidirectional switch 110, 130 when the bidirectional switch 110, 130 engages in non-switching operation, though the jump voltage peak Vrp depends on the value $V_{DC}$ in FIGS. 32 and 33.

In addition, from the results shown in FIGS. 25 and 28, it was proved that when the turn-on di/dt of the main IGBTs was made smaller than 0.8 kA/μs (the portion shown by the dotted line in each drawing), the reverse recovery current peak Irp in the second example could be made nearly equal to or lower than the reverse recovery current peak Irp of the FWDs in the second comparative example in which the turn-on di/dt of the main IGBTs was about 1.6 kA/μs. From the results shown in FIGS. 26 and 29, it was proved that when the turn-on di/dt of the main IGBTs was made smaller than 0.8 kA/μs (the portion shown by the dotted line in each drawing), the reverse recovery loss Err in the second example could be made nearly equal to or lower than the reverse recovery loss Err of the FWDs in the second comparative example in which the turn-on di/dt of the main IGBTs was about 1.6 kA/μs. The switching loss in the second example in which the turn-on di/dt of the main IGBTs was made smaller than 0.8 kA/μs could be made nearly equal to or lower than the switching loss in the second comparative example in which the turn-on di/dt of the main IGBTs was about 1.6 kA/μs.

(About Power Loss)

Next, the power loss when driving was controlled so that the turn-on di/dt of the main IGBTs was made smaller than 0.8 kA/μs was verified. First, 24 devices of the first example each with a rated current of 50 A were connected in parallel so as to form a bidirectional switch 130 with a rated current of 1,200 A, and an A-NPC circuit configured in such a manner that the intermediate potential of the main switch 100 was clamped by the bidirectional switch 130 was manufactured (hereinafter referred to as "third example", in which the bidirectional switch 130 was constituted by 24 RB-IGBTs connected in parallel in the A-NPC circuit shown in FIG. 33).

As a comparative example, 24 devices of the first comparative example each with a rated current 50 A were connected in parallel so as to form a bidirectional switch 110 with a rated current of 1,200 A, and an A-NPC circuit configured in such a manner that the intermediate potential of the main switch 100 was clamped by the bidirectional switch 110 was manufactured (hereinafter referred to as "third comparative example", in which the bidirectional switch 110 was constituted by the combination of 24 IGBTs and 24 FWDs in the A-NPC circuit shown in FIG. 32).

In the third example and the third comparative example, driving was controlled to make the turn-on di/dt of the main IGBTs 100 smaller than 0.8 kA/μs, and the switching loss was measured in each operation mode. Junction temperature Tj during measurement was set at 125° C. Bus voltage Vbus was set at 900 V (=½×DC current $V_{DC}$). The junction temperature Tj is a temperature near the pn junction between the n⁻ drift region and the p base region.

Next, the power loss in each operation mode was calculated based on the switching loss in the operation mode in each of the cases where the carrier frequency fc was 500 Hz and 1,000 Hz. The power loss was calculated on the assumption that the output current Io of the main switch 100 was 400 Arms, and the output frequency of the main switch 100 was 60 Hz. In addition, it was assumed that the power factor of the main switch 100 was 0.8, and the pulse width modulation ratio of the main switch 100 was 0.8.

Figure 30:
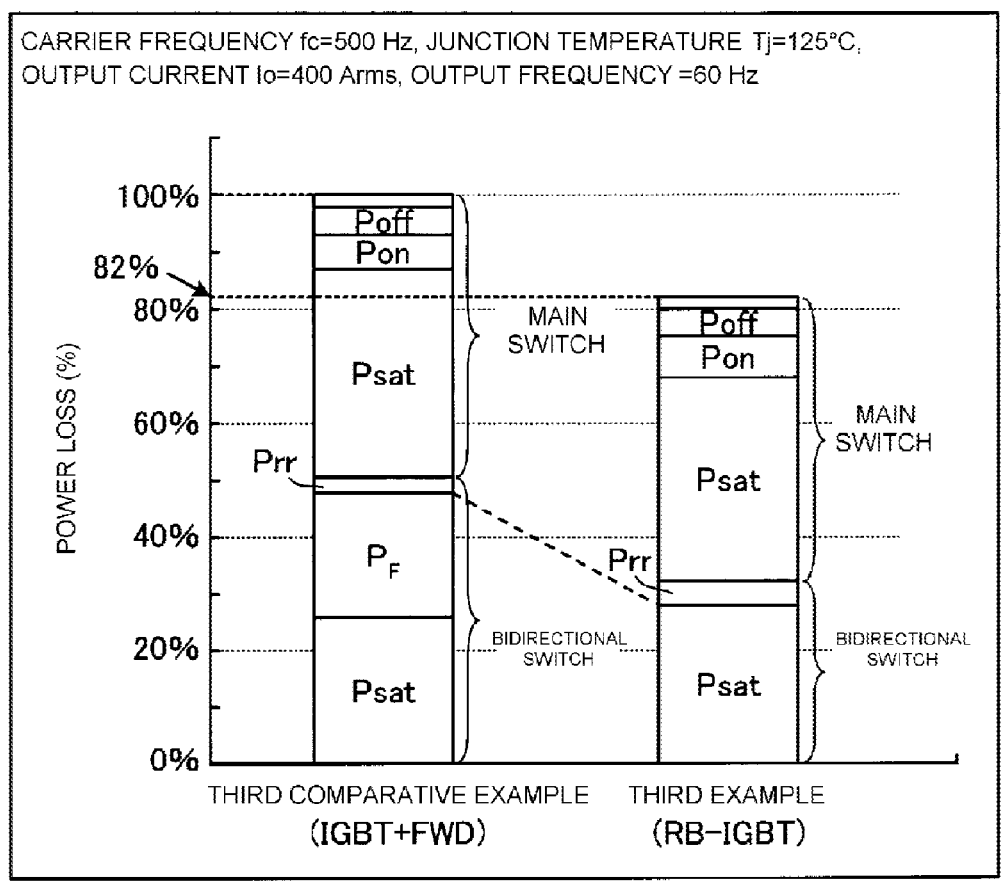
FIG. 30 is a characteristic graph showing the power loss in each operation mode of a semiconductor device according to a third example (carrier frequency 500 Hz)
Figure 31:
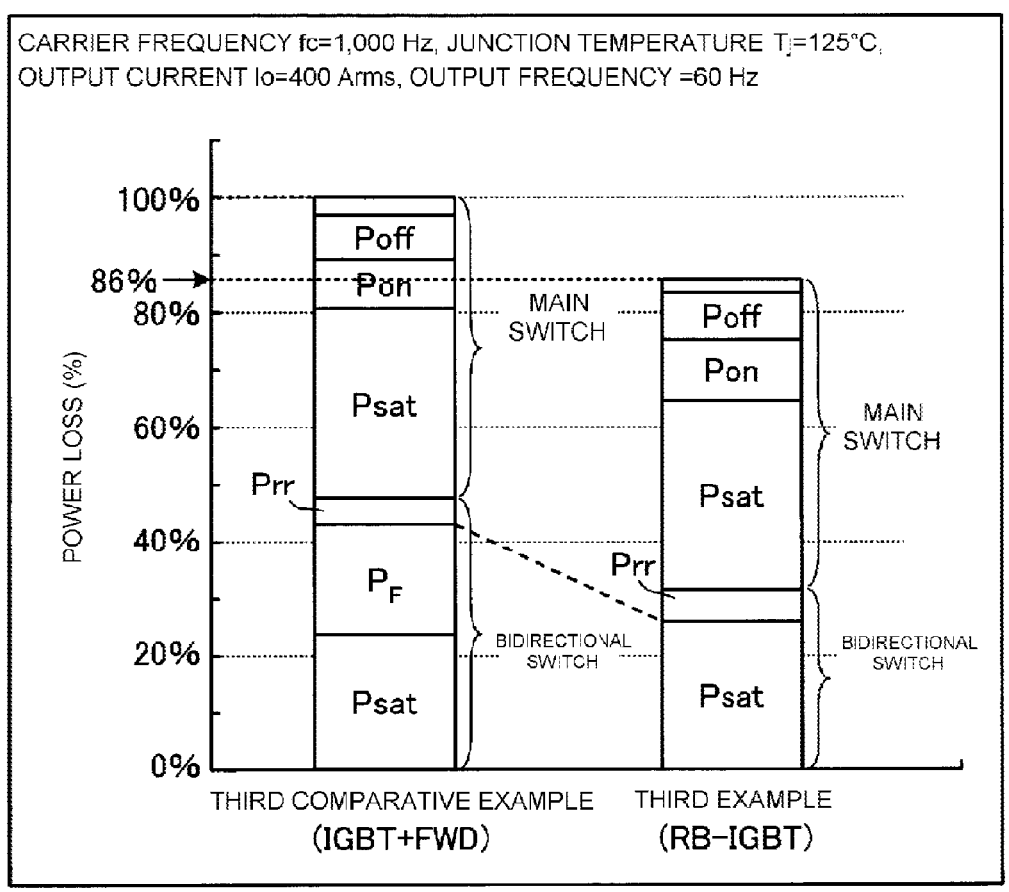
FIG. 31 is a characteristic graph showing the power loss in each operation mode of the semiconductor device according to the third example (carrier frequency 1,000 Hz)

FIGS. 30 and 31 show the power loss in each operation mode. FIGS. 30 and 31 are characteristic graphs showing the power loss in each operation mode of the semiconductor device according to the third example. FIGS. 30 and 31 show the power loss ratio in each operation mode when the total power loss in the third comparative example was regarded as 100%. The total power loss in the third example is the total sum of the turn-off loss Poff, the turn-on loss Pon and the standing loss Psat of the main switch 100, the FWDs 103 and 104 constituting the main switch 100, and the reverse recovery loss Prr and the standing loss Psat in the bidirectional switch 130.

On the other hand, the total power loss in the third comparative example is the total sum of the turn-off loss Poff, the turn-on loss Pon and the standing loss Psat of the main switch 100, the FWDs 103 and 104 constituting the main switch 100, the reverse recovery loss Prr and the forward recovery loss $P_F$ in the FWDs of the bidirectional switch 110, and the standing loss Psat in the bidirectional switch 110. Since the reverse recovery loss Prr is not generated in the third example, the total power loss can be reduced in comparison with the third comparative example even when the standing loss Psat increases in comparison with the third comparative example.

From the result shown in FIG. 30, it was proved that when the carrier frequency fc was 500 Hz, the total power loss in the third example was 82%, and the third example could attain reduction in loss by 18% in comparison with the third comparative example. In addition, from the result shown in FIG. 31, it was proved that when the carrier frequency fc was 1,000 Hz, the total power loss in the third example was 86%, and the third example could attain reduction in loss by 14% in comparison with the third comparative example. Thus, it was proved that the third example could reduce the power loss in comparison with the third comparative example when driving was controlled so that the turn-on di/dt of the main IGBTs could be made smaller than 0.8 kA/μs.

In the aforementioned description, the invention is not limited to the aforementioned embodiments, but various changes can be made thereon without departing from the gist of the invention. For example, various settings about the dimensions or surface concentration of each part, the number of elements constituting a circuit, the operating conditions of the circuit, etc. may be allowed in accordance with required specifications or the like. In addition, the aforementioned embodiments have been described when a front surface element structure of a planar gate structure is provided by way of example. However, the front surface element structure of the planar gate structure may be replaced by a front surface element structure of a trench gate structure. In addition, the n type and the p type may be reversed entirely in the invention.

As described above, the semiconductor device, the method for manufacturing the semiconductor device and the method for controlling the semiconductor device according to the invention are useful in a power semiconductor device for use in power conversion equipment or the like.

What is claimed is:

1. A semiconductor device comprising:
a first semiconductor region of a first conductivity type, wherein the first semiconductor region is a substrate;
a second semiconductor region of a second conductivity type which is selectively provided in a surface layer of one side of the first semiconductor region;
a third semiconductor region of the first conductivity type which is selectively provided inside the second semiconductor region;
a gate electrode which is provided in a surface of a portion of the second semiconductor region which is located between the first semiconductor region and the third semiconductor region, a gate insulating film being put between the gate electrode and the second semiconductor region;
a fourth semiconductor region of the second conductivity type which is provided on another side of the first semiconductor region;
a low life time region which is provided in an interface between the first semiconductor region and the fourth semiconductor region and which is shorter in carrier life time than any other region;
a fifth semiconductor region of the second conductivity type which is provided in an outer circumferential portion of the first semiconductor region so as to extend from the one side of the first semiconductor region, penetrate the first semiconductor region and the low life time region and reach the fourth semiconductor region;
a first electrode which touches the second semiconductor region and the third semiconductor region; and
a second electrode which touches the fourth semiconductor region; wherein:
the first semiconductor region is set to have a predetermined carrier life time by light ion irradiation to reduce the carrier life time;
the light ion irradiation is carried out at acceleration energy from 4 MeV to 6 MeV and dose from 10 kGry to 30 kGry; and
the low life time region is provided on a surface opposite a terminal structure of the semiconductor device and reaches the fifth semiconductor region.

2. A semiconductor device according to claim 1, wherein: the first semiconductor region is set at the predetermined carrier life time by the light ion irradiation and annealing which is performed at temperature from 320° C. to 340° C. for 50 minutes to 70 minutes after the light ion irradiation.

3. A semiconductor device according to claim 1, further comprising:
a groove which is provided in an outer circumferential portion of the first semiconductor region and on the other side of the first semiconductor region; wherein:
the fourth semiconductor region is provided along an inner wall of the groove on the other side of the first semiconductor region; and
the fifth semiconductor region is provided to extend from the one side of the first semiconductor region and reach the groove.

4. A semiconductor device according to claim 3, wherein: the first semiconductor region is 250 μm to 290 μm thick.

5. A semiconductor device according to claim 1, wherein: the first semiconductor region is 250 μm to 290 μm thick.

6. A semiconductor device according to claim 1, wherein: the first semiconductor region is set at the predetermined carrier life time by the light ion irradiation and annealing which is performed at temperature from 320° C. to 340° C. for 50 minutes to 70 minutes after the light ion irradiation.

7. A semiconductor device comprising:
a first semiconductor element;
a second semiconductor element which is electrically connected to an intermediate potential point between a high potential point and a low potential point of the first semiconductor element, the second semiconductor element including a first semiconductor region of a first conductivity type, a second semiconductor region of a second conductivity type which is selectively provided in a surface layer of one side of the first semiconductor region, a third semiconductor region of the first conductivity type which is selectively provided inside the second semiconductor region, a gate electrode which is provided in a surface of a portion of the second semiconductor region which is located between the first semiconductor region and the third semiconductor region, a gate insulating film being put between the gate electrode and the second semiconductor region, a fourth semiconductor region of the second conductivity type which is provided on another side of the first semiconductor region, a low life time region which is provided in an interface between the first semiconductor region and the fourth semiconductor region and which is shorter in carrier life time than any other region, a fifth semiconductor region of the second conductivity type which is provided in an outer circumferential portion of the first semiconductor region so as to extend from the one side of the first semiconductor region, penetrate the first semiconductor region and the low life time region and reach the fourth semiconductor region, a first electrode which touches the second semiconductor region and the third semiconductor region, and a second electrode which touches the fourth semiconductor region; and a control unit which controls the first semiconductor element and the second semiconductor element; wherein:

the control unit turns on the first semiconductor element in order to bring the second semiconductor element into reverse recovery, and makes a variation of a current flowing in a turn-on state of the first semiconductor element smaller than 0.8 kA/µs;

the first semiconductor region is set to have a predetermined carrier life time by light ion irradiation to reduce the carrier life time;

the light ion irradiation is carried out at acceleration energy from 4 MeV to 6 MeV and dose from 10 kGry to 30 kGry; and the low life time region is provided on a surface opposite a terminal structure of the semiconductor device and reaches the fifth semiconductor region.

8. A semiconductor device according to claim 7, further comprising:

a groove which is provided in an outer circumferential portion of the first semiconductor region and on the other side of the first semiconductor region; wherein:

the fourth semiconductor region is provided along an inner wall of the groove on the other side of the first semiconductor region; and the fifth semiconductor region is provided to extend from the one side of the first semiconductor region and reach the groove.

9. A semiconductor device according to claim 7, wherein: the first semiconductor region is 250 µm to 290 µm thick.

10. A method for controlling a semiconductor device including a first semiconductor element and a second semiconductor element which is electrically connected to an intermediate potential point between a high potential point and a low potential point of the first semiconductor element, the second semiconductor element including a first semiconductor region of a first conductivity type, a second semiconductor region of a second conductivity type which is selectively provided in a surface layer of one side of the first semiconductor region, a third semiconductor region of the first conductivity type which is selectively provided inside the second semiconductor region, a gate electrode which is provided in a surface of a portion of the second semiconductor region which is located between the first semiconductor region and the third semiconductor region, a gate insulating film being put between the gate electrode and the second semiconductor region, a fourth semiconductor region of the second conductivity type which is provided on another side of the first semiconductor region, a low life time region which is provided in an interface between the first semiconductor region and the fourth semiconductor region and which is shorter in carrier life time than any other region, a fifth semiconductor region of the second conductivity type which is provided in an outer circumferential portion of the first semiconductor region so as to extend from the one side of the first semiconductor region, penetrate the first semiconductor region and the low life time region and reach the fourth semiconductor region, a first electrode which touches the second semiconductor region and the third semiconductor region, and a second electrode which touches the fourth semiconductor region, the method for controlling the semiconductor device comprising the step of:

turning on the first semiconductor element in order to bring the second semiconductor element into reverse recovery, and making a variation of a current flowing in a turn-on state of the first semiconductor element smaller than 0.8 kA/µs; and wherein:

the first semiconductor region is set to have a predetermined carrier life time by light ion irradiation to reduce the carrier life time;

the light ion irradiation is carried out at acceleration energy from 4 MeV to 6 MeV and dose from 10 kGry to 30 kGry; and the low life time region is provided on a surface opposite a terminal structure of the semiconductor device and reaches the fifth semiconductor region.

11. A device, comprising:

a substrate region of a first conductivity type, and having irradiated carriers, wherein a concentration of the irradiated carriers corresponds to light ion irradiation carried out at acceleration energy from 4 MeV to 6 MeV and dose from 10 kGry to 30 kGry;

at least two regions of a second conductivity type formed in a surface of the substrate region;

an emitter region formed in each of the at least two regions of the second conductivity type;

a contact region formed in each of the at least two regions of the second conductivity type;

a collector region formed on an opposite surface of the substrate region;

an interface region formed between the collector region and the substrate region on a surface opposite a terminal structure of the device, the interface region having carriers with lifetimes shorter than in any of other regions of the device;

an electrode in contact with each emitter region and each contact region; and an electrode in contact with the collector region.

* * * * *